United States Patent [19]

Banki et al.

[11] Patent Number: 4,873,647

[45] Date of Patent: Oct. 10, 1989

[54] DIGITAL WAVEFORM ANALYZER

[75] Inventors: Mehrdad Banki; Kevin M. Bush; William O. McDermith, all of Colorado Springs, Colo.

[73] Assignee: Minc Incorporated, Colorado Springs, Colo.

[21] Appl. No.: 142,652

[22] Filed: Jan. 11, 1988

[51] Int. Cl.⁴ .......................... G06F 15/60; G06G 7/48
[52] U.S. Cl. ..................... 364/488; 364/300; 364/578; 364/200; 364/487
[58] Field of Search ............... 364/200, 300, 900, 578, 364/487–491; 340/347 DD; 341/50, 78, 126, 144, 155; 324/77 R

[56] References Cited

U.S. PATENT DOCUMENTS

| | | | |
|---|---|---|---|
| 4,635,208 | 1/1987 | Coleby et al. | 364/490 |
| 4,638,442 | 1/1987 | Bryant et al. | 364/489 |
| 4,672,532 | 6/1987 | JongeVos | 364/300 |
| 4,703,435 | 10/1987 | Darringer et al. | 364/488 |

OTHER PUBLICATIONS

J. L. Eggert, "Flowchart Technique for Computer-Aided Design of Small Computers", Computer Design, Nov. 1973, pp. 73–81.

C. H. House, "Development System Lay Basis for Fully Integrated VLSI Design Center", Electronics, Feb. 1980, (53 #5), pp. 143–147.

P. Groner, "Computer Aided Design of VLSI Saves Man-Hours, Reduces Errors", Control Engineering, Apr. 1981, pp. 55–57.

Primary Examiner—Parshotam S. Lall
Assistant Examiner—Kevin Teska
Attorney, Agent, or Firm—Dorr, Carson, Sloan & Peterson

[57] ABSTRACT

An automated waveform analyzer for designing, on a computer, a logic implementation of an interface circuit connected between a first digital device and one or more other digital devices. The analyzer identifies from the remaining input and output waveforms those waveforms that, when logically combined together, construct the waveform of a selected output waveform in order to provide the proper logic and timing compatibility between the devices.

15 Claims, 22 Drawing Sheets

AVAILABLE LIST FILE

| EQUATION BUFFER | TAG | VECTOR |
|---|---|---|
| INDEX (I5) | | 0 |
| | | I1 |
| | | I2 |
| | | I3 |
| | NO | I4 |
| | | I5 |
| | | I6 |

Fig. 10  OPTIONS LIST

| EQUATION BUFFER | VECTOR |
|---|---|
| INDEX I(5) | 0 |
|  | I1 |
|  | I2 |
|  | I3 |
|  | I4 |
|  | I5 |
|  | I6 |
|  | ⋮ |

Fig. 13  ERROR BLOCK

| VECTOR NAME | MESSAGE | TIME UNIT | ERROR TYPE |
|---|---|---|---|
|  |  |  |  |
|  |  |  |  |

DIGITAL WAVEFORM ANALYZER

BACKGROUND OF THE INVENTION

1. Field of the Invention

The present invention relates in general to a method and apparatus for analyzing the timing and logical relationships among digital waveforms. More particularly, the present invention relates to an apparatus and method for analyzing the relationships between binary waveform inputs and outputs of two digital devices to generate the logic implementation for the design of an interface circuit between the two or more digital devices so that the interface circuit permits logic and timing compatibility between the devices.

2. Background Discussion

A problem in the design of digital systems is the incompatibility of the various components from different manufacturers. For example, the manufacturer of a computer will specify the various input and output binary signals necessary to communicate with its computer. Likewise, the manufacturers of the peripheral devices that interconnect with the computer also provide detailed signal specifications for interconnecting the inputs and the outputs of the devices. While some manufacturers of peripheral devices specifically manufacture the device to communicate with a given processor, it is more common to design an interface circuit that allows a peripheral device to communicate with a computer or another interface device. These interface devices provide the necessary logic and timing compatibility. Some peripheral devices have several interface circuits for each different function they perform.

It is difficult to design interface circuits since the engineer must manually determine the necessary Boolean logic equations in the design of the interface circuit so that a peripheral device or system is fully compatible with the computer.

The problem of compatibility is not limited to processors and digital devices but is a common problem between any digital device that must communicate with another digital device.

SUMMARY OF THE INVENTION

The present invention provides an automated waveform analyzer for designing, on a computer, a logic implementation of an interface circuit connected between a first digital device (or first group of devices) and a second digital device (or second group of devices). The input and output waveforms from the first and second digital devices which interconnect the interface circuit are inputted into the computer. Each input and output waveform has its identity (signal name), whether the waveform is an output or input signal, and the time of each asserted and non-asserted pulse in the waveform entered into the computer. This waveform information for each waveform is stored in a memory of the computer in an Available List file. Based upon this information, the computer will select the first output waveform and then identify from the Available List file all of the other waveforms, or their compliments, which alone or either ANDed or ORed with other waveforms in the list constructs the selected waveform output in a fashion to permit logic and timing compatibility between the first and second devices.

If waveforms are successfully identified in which to construct the selected output waveform, the identity of each waveform necessary for construction, the logical operation required such as compliment, AND, or OR, for each identified waveform and the time of each asserted and non-asserted pulse in the constructed waveform is outputted from the computer. In the event the waveforms in the Available List file cannot be used to construct the selected output waveform, then an error signal is reported. The error signal may be used to complete processing or as a report to the operator.

The process of identifying and constructing waveforms is repeated for each remaining output waveform in the Available List file.

The information generated by the waveform analysis apparatus and method of the present invention enables a designer to design the interface circuit for logic and timing compatibility between the two digital devices.

BRIEF DESCRIPTION OF THE DRAWING

FIG. 10 sets forth the format for an options list in memory;

FIG. 13 is the format for the error block in memory;

GENERAL DESCRIPTION

Figure 1:
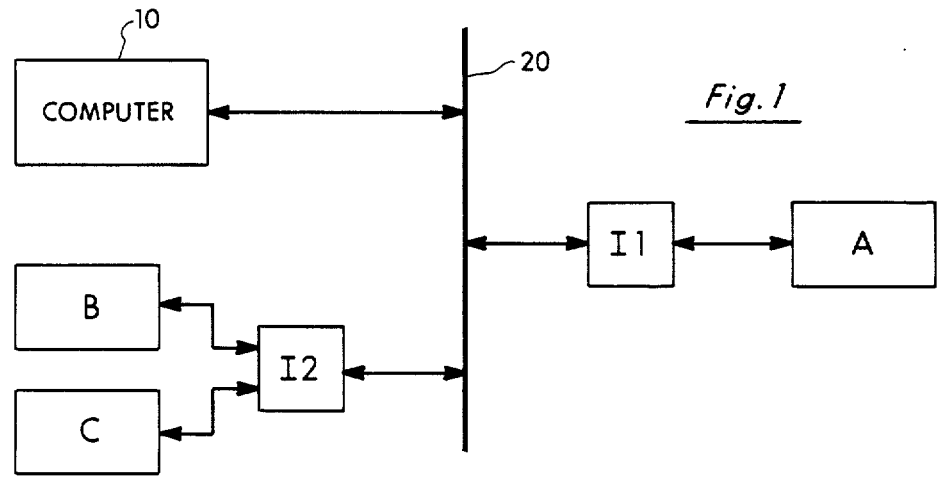
FIG. 1 shows a conventional system arrangement having a computer interconnected to a variety of peripheral devices through selected interfaces.

In FIG. 1 is shown a conventional arrangement having a processor or computer 10 interconnected to a bus 20 in order to communicate with a plurality of peripheral devices A, B and C. Peripheral devices may be discrete circuits, peripherally or systems or portions thereof. The processor and each peripheral device has its own characteristic digital input and output signals as specified by the manufacturer. The present invention provides an apparatus and method for analyzing the digital input and output waveform signals of the processor 10 and of the peripheral device A in order to generate the logic to enable an engineer to design the interface I1. Likewise, the input and output signals of the processor and peripheral devices B and C can also be evaluated according to the method of the present invention to generate the logic to enable a logic designer to create interface I2 to serve both devices. FIG. 1 illustrates only one application for the present invention.

Figure 2:
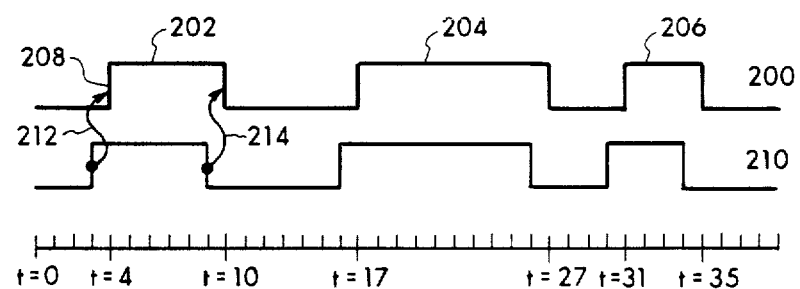
FIG. 2 shows a conventional input or output waveform from a computer or a peripheral device.

An example of an input or output waveform that might be utilized by the processor 10 or peripheral devices A, B, or C, is shown in FIG. 2. The waveform 200 has three high digital pulses 202, 204, and 206. The term "pulse" refers to the length of time that a signal is at a given voltage level. For example, in FIG. 2, pulse 202 starts at a time unit t=4 and continues to a time unit of t=10. A pulse can be defined as either high (as in FIG. 2) or low. When a pulse of a specified value is present, the waveform is defined as being "asserted" and when the pulse is not present it is "nonasserted". The change between different levels of a waveform is called a transition (such as transition 208) which in digital systems is also called an edge. In the following, the specified value is high and the asserted state is a high pulse.

In the following, the waveform analysis techniques of the present invention are applied to synchronous digital circuits. However, these techniques can be applied to asynchronous digital circuits.

Under the teachings of the present invention, all digital waveforms can be represented as vectors. For example, and with reference to FIG. 2, pulse 202 can be represented as a pair of integers (1, 4) and (0, 10) where the first integer indicates whether the voltage is high or low and the second integer indicates when the pulse is asserted in the time units. For example, waveform 200 can be represented by the following: (0, 4), (1, 10), (0, 17), (1, 27), (0, 31), (1, 35), and (0, 40). The goal of the present invention is to construct waveform 200 from the other output and input waveforms such as waveform 210. Because of the use of the interface circuit, the constructed waveform 200 is delayed by one time unit from waveform 210 by indicating arrows 212 and 214 in order to provide the necessary compatibility.

Figure 3:
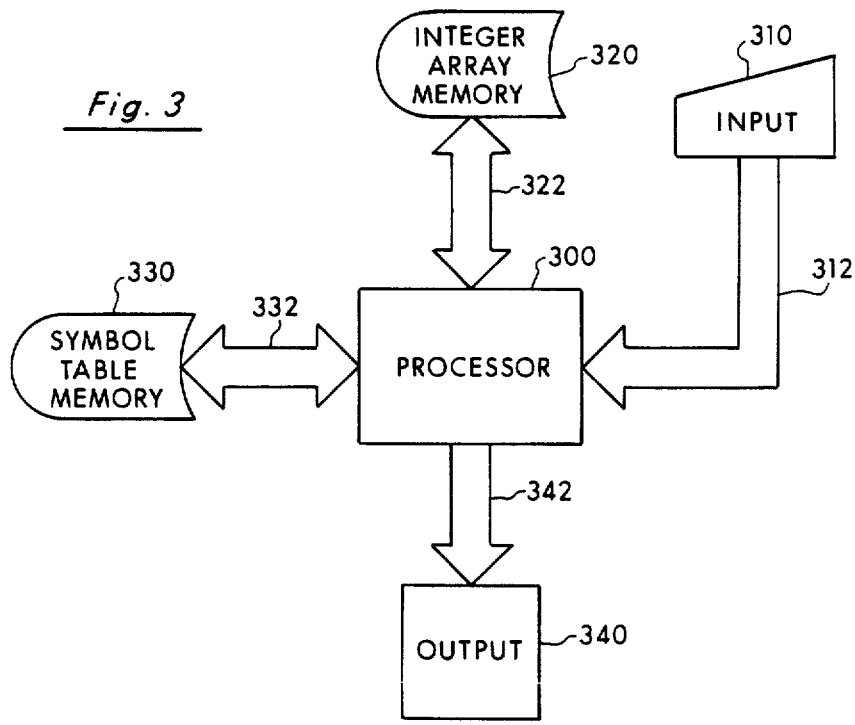
FIG. 3 sets forth the system arrangement of the present invention.

FIG. 3 shows the basic hardware of the present invention to include a processor 300, an input device 310 such as a keyboard or a mouse, an integer array memory 320, a symbol table memory 330, and an output 340. The input 310 inputs information to the processor 300 over path 312. The input 310 could also be a digitizing oscilloscope, waveform recorder, signal source, tablet keyboard, or a logic analyzer. The processor 300 over path 322 is in bidirectional communication with the integer array memory 320 and the processor 300 over path 332 is in two-way communication with the symbol table memory 330. Under the teachings of the present invention, the processor outputs the information over path 342 to the output 340. This information, for each selected output, contains the identity the other waveforms or their compliments which alone or in combination (i.e., ANDed or ORed) with other waveforms logically construct the selected output so that they permit the necessary logical and timing compatibility between the two digital devices. In the preferred embodiment, the logical and timing relationship requires that the constructed pulse have its assertion one time unit prior to the assertion of the selected output and its deassertion one time unit before the selected outputs deassertion. However, the parameters necessary for achieving compatibility can vary from that of the preferred embodiment.

As will be explained in the Detailed Description, three Unique conditions of Unique Previous, Unique After, and Unique End must be satisfied in the process of waveform construction. Seldom will one waveform meet all three of these Unique conditions. If a single waveform does not meet all three requirements, it may be combined with one or more other waveforms using Boolean logic. Boolean logic operators include the symbols:

\* (AND)

+(OR)

(NOT or One's complement)

Signals are ANDed together to eliminate a transition. Signals are ORed together to extend a pulse. A signal's complement is used when the signal would be descriptive if the high and low levels were inverted. Like single waveforms, waveform Boolean combinations must also satisfy the three Unique conditions.

The preferred embodiment of the present invention uses an IBM Personal Computer or a compatible thereof for processor 300 with a minimum memory of 512K, a hard disk drive, a floppy disk drive, a color/-graphics card or adapter, and an 80-column monochrome or color monitor. The operating system for the processor 300 is DOS 2.0 or later versions. The input 310 is an IBM Personal Computer Keyboard and/or a mouse. The output 340 is a standard input JEDEC RS-232C universal device programmer.

DETAILED DESCRIPTION

1. Waveform Input

In operation, a series of given waveforms such as the waveform of FIG. 2 is entered into the processor 300 through the input 310. The operator enters each waveform showing all asserted and nonasserted pulses or states for each unit of time for all of the inputs and for all of the outputs between the two digital devices that must be interconnected. The name (identity) of each waveform is stored in memory 330 and the waveform transitions are stored in vector format in the integer array memory 320. After analysis of the various inputs and outputs, the present invention delivers an output 340 that provides the design information necessary, for example, to create the file for the design of the interface devices I1 and I2 of FIG. 1 or for waveform simulation testing.

The result of inputting the waveforms is the establishment of the symbol table in memory 330 having the following type of information:

$$XX \ O/I \ V_1{:}t_1 \ V_2{:}t_2 \ V_1{:}t_3 \ V_2{:}t_y \dots$$

The term "XX" is the name and index to the location of the waveform in the symbol table in memory 330 and is preferably sixteen bits long. The term 0/I designate whether the waveform is an OUTPUT or an INPUT which in the preferred embodiment is sixteen bits and the "V:t" is the vector "assertion level:time" information. For the output waveform of FIG. 2 the following is the waveform information:

XX OUTPUT L:4 H:10 L:17 H:27 L:31 H:35 L:40

All waveforms, in the preferred embodiment, are entered with the initial level low. As will be explained later, if a particular waveform starts out high, that waveform is inverted to start out low and is marked as LOW TRUE when used by the Extract process.

Figure 4:
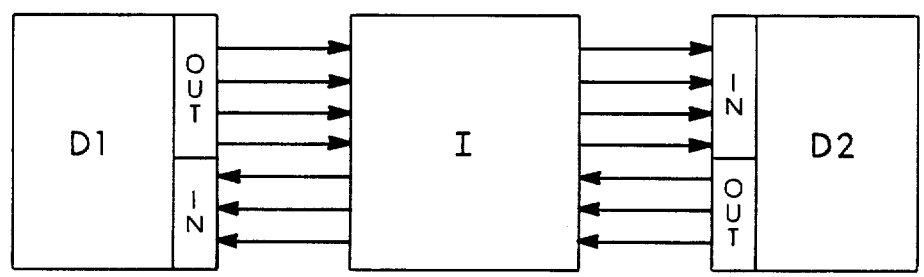
FIG. 4 is a conventional interface between two digital devices.

At the completion of the input stage, and with reference to FIG. 4, all of the output and input waveforms required to operate device D1 with device D2 have been entered into the symbol table 330 and all of the input and output waveforms for device D2 to operate with device D1 have also been entered. The present invention will now analyze those output and input waveforms to generate or construct the Boolean logic equations necessary to implement the design for interface I. For example, the present invention will generate the equations for implementing the interface in a programmable logic device or other suitable device. The term "interface" can encompass a variety of circuit configurations. For example, the interface could be as simple as a logical inversion of a signal to the complexity of the numerous functions in an entire computer system. Furthermore, while the preferred embodiment discusses an interface between digital devices, devices other than digital can be used such as a digital to analog converter.

2. Overall Flow Chart (FIG. 5)

Figure 5:
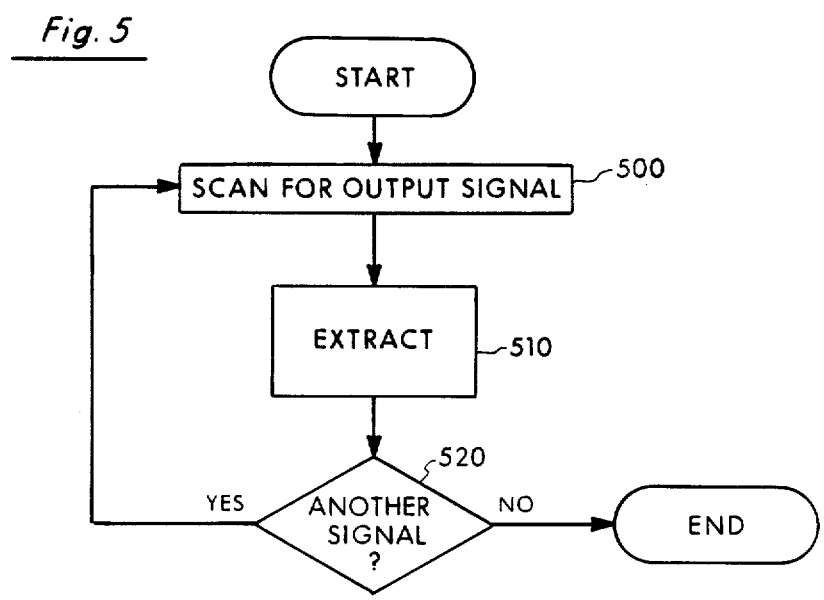
FIG. 5 is the flow chart for the main routine of the present invention.

In FIG. 5, the overall flow chart of the software of the present invention is shown. The symbol table 330 is initially scanned 500 by the computer for the first "output" signal. When it is retrieved, the Extract routine 510 is entered. The Extract routine via the computer performs the analysis on the output signal and when completed inquires as to whether or not 520 there is another "output" signal. If there is, it retrieves that signal, analyzes it, and continues until no other output signal exists at which time all waveform analysis under the present invention is completed and the results delivered to the output 340.

3. Extract (FIG. 6)

Figure 6:
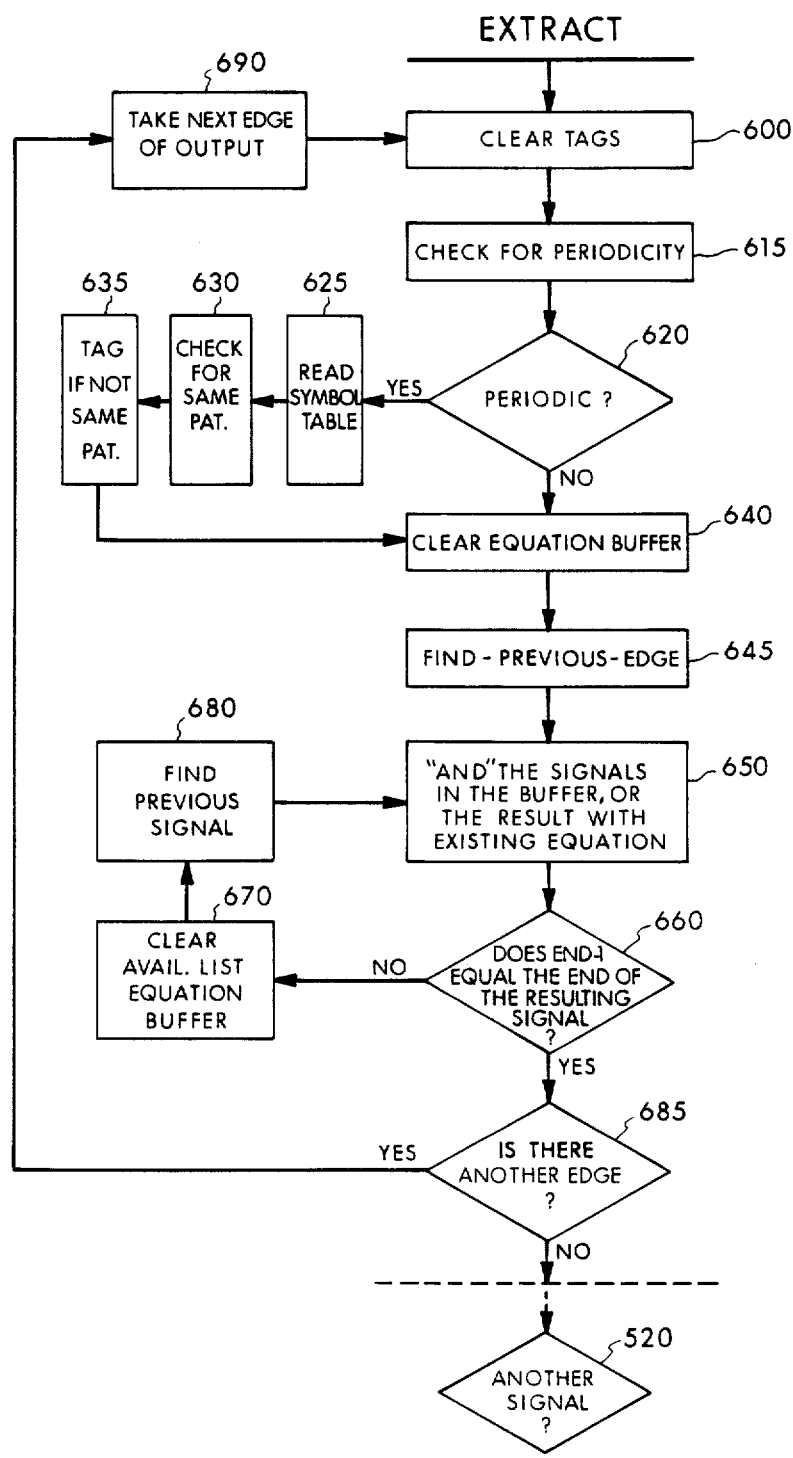
FIG. 6 shows the "Extract" routine of the present invention.

The Extract routine is shown in FIG. 6. The goal of the Extract routine 510 is the writing of a Boolean equation for a selected output signal. The Extract routine tries to find single waveforms or their compliments or combinations of the other output and input signals (ANDed and/or ORed together) to cover the asserted portions of the selected output signal in the form necessary for compatibility and then writes the Boolean equation for that output signal. At the outset, the signal tags are cleared 600 (this will be discussed later) and the waveform selected is checked for periodicity 615.

For example, assume the waveform being analyzed is represented by the following vectors:

L:12 H:32 L:62 H:82 L:112 H:190

Periodicity can be determined based upon the following two formulas:

$$\text{Width of High Pulse} = \text{Edge @ (Start + 1)} - \text{Edge @ (Start)} \quad \text{FORMULA 1}$$

$$\text{Width of Low Pulse} = \text{Edge @ (Start + 2)} - \text{Edge @ (Start + 1)} \quad \text{FORMULA 2}$$

Figures 7, 8:
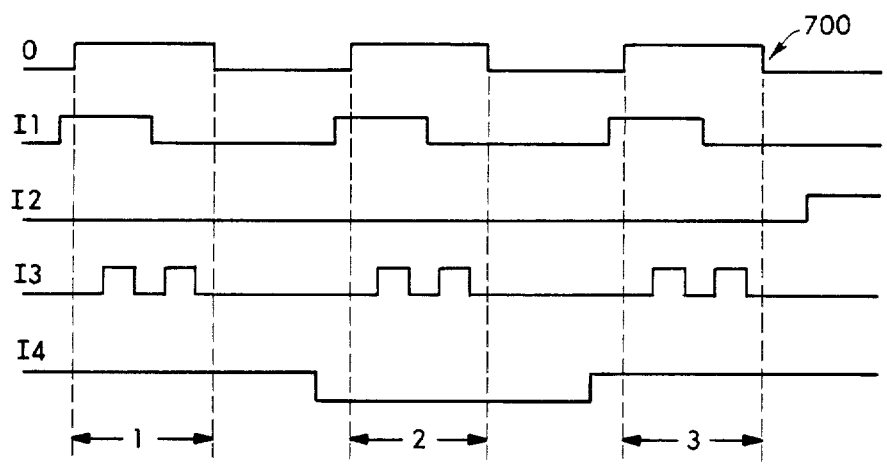
FIG. 7 sets forth a series of waveforms that are periodic and non-periodic.
FIG. 8 illustrates the construction of the Available List file in memory.

Hence, applying the formulas to the above example, all of the low pulses have a width of 20 and all of the high pulses have a width of 30 and, therefore, the above waveform is periodic. If it is periodic 620, the symbol table 330 is read 625 and each vector in the symbol table including the vector being analyzed by the Extract routine is again checked for the same pattern 630 - i.e., the same pattern through each of the times (as shown by periods 1, 2, and 3 of FIG. 7) that the selected output is asserted (henceforth defined as "periodic when the selected output is periodic"). If a waveform does not have the same pattern of periodicity then it is tagged 635 in an Available List file which appears in integer array memory 320 and is shown in FIG. 8. For example, in FIG. 8, vector 4 does not have the same pattern in each of the asserted portions of the selected output 0 and is appropriately tagged. Upon the completion of this process, the equation buffer portion of the Available List file is cleared 640. The TAGS remain so that only the untagged information found in the Available List file are the vectors to be used for writing the equation for the selected output.

When the Extract routine was entered, the first step 600 was to clear the signal tags and, it is apparent that function clears out all prior tag information in the Available List file. Hence, at the step of Find Previous Edge 645 a given vector has been analyzed for periodicity and all the other vectors not having the same pattern of periodicity were tagged as NO.

Figure 9:
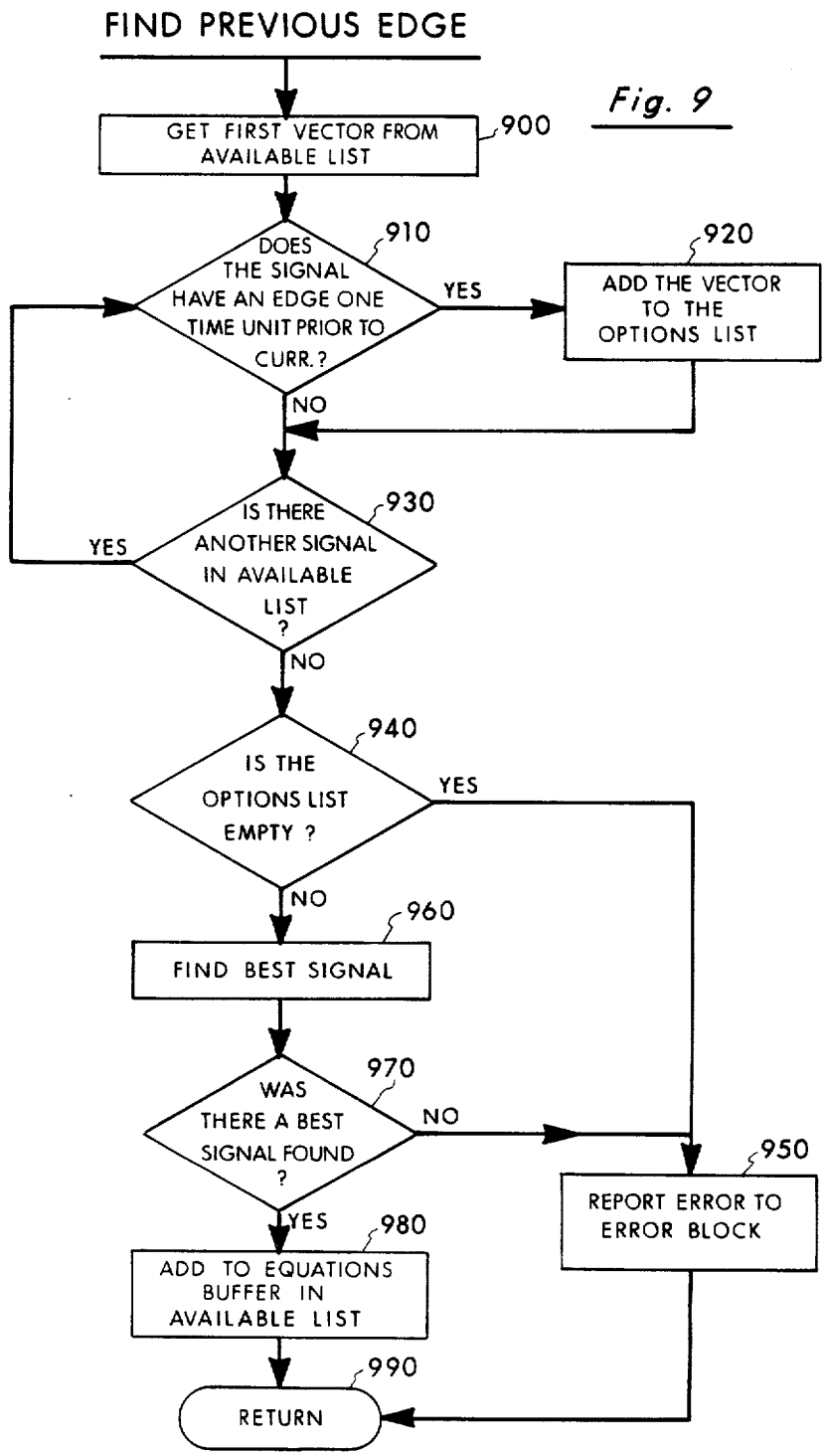
FIG. 9 sets forth the flow chart for the "Find Previous Edge" routine.

The system then enters the Find Previous Edge routine 645 (see FIG. 9).

In other words and in reference back to Section 3 (FIG. 6), waveforms will be combined through use of Boolean operators. Signals are ANDed together to eliminate a transition and are ORed together to extend a pulse.

Figure 35:
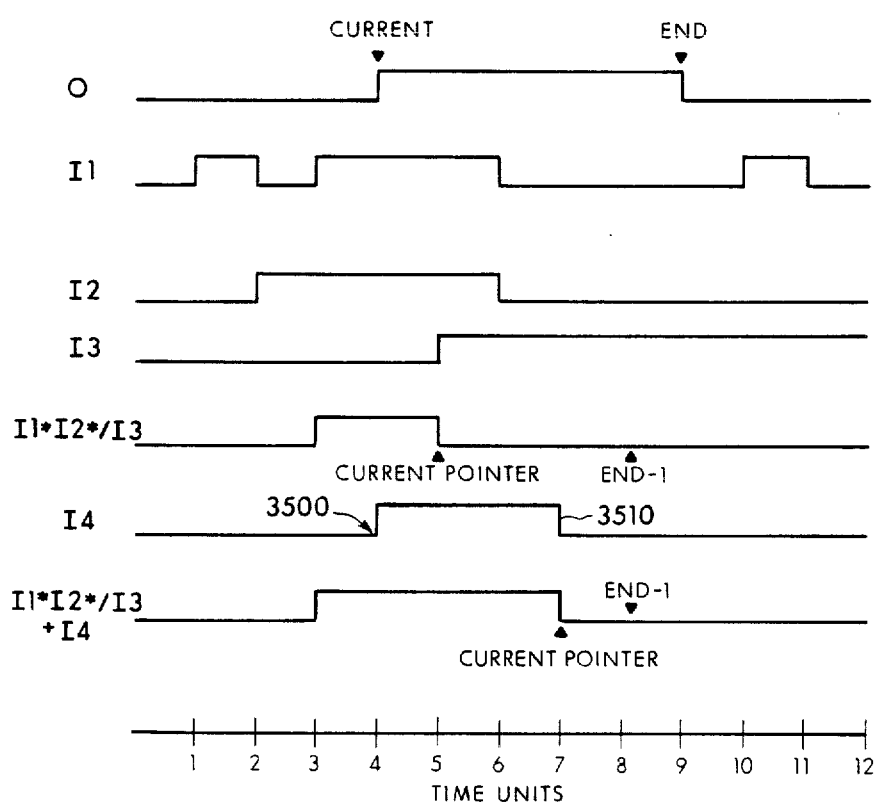
FIG. 35 is a waveform illustration of the current pointer evaluation.

The program of the present invention has created a portion of the selected output and it is now desired to find those signals necessary to complete the selected output. For example, suppose in FIG. 35 the product of I1*I2*/I3 results in the waveform shown in FIG. 35. The product is formed in stage 650. Stage 660 then determines whether the "End minus one" time unit equals the End of the resulting signal. As shown in FIG. 35, the end of the combined signal I1*I2*/I3 does not end at "End minus one." In this case, additional signals will be required to construct the desired waveform. Hence the equation buffer is cleared 670 and the Find Previous Signal 680 stage is entered.

In summary, once a signal has been found to be periodic, all of the other signals in the symbol table are read including the signal being analyzed to determine all signals that have the same pattern across the periodic pulses of the selected output. If the pattern is dissimilar, then those signals are tagged. For example, in FIG. 7, the selected output signal 700 has been found to be periodic. The symbol table is then read for all other input and output waveforms and each waveform is loaded into the Available List file shown in FIG. 8. Hence, in FIG. 8, each of the vectors are loaded into the Available List file which appears in the integer array memory 320. As shown in FIG. 7, Waveform I1 is periodic when output 0 is periodic. Likewise, waveform I2 and I3 are also periodic when output 0 is periodic. Signal I4, however, is not periodic when the selected output 0 is periodic and is tagged appropriately. A tag entry of NO means that particular vector cannot be used in the generation of an equation for the output signal being analyzed. In the preferred embodiment, the tag field is eight bits wide.

In Find Previous Edge 645, an attempt is made to cover the maximum portion of the selected output starting at the current edge of the asserted pulse. At 650, the equation for the covered portion is written out and if the resulting signal did not cover 660 the entire portion of the selected output from current to "End minus one", then current is set to end of resulting signal as shown in FIG. 35. Then the available list equation buffer is cleared 670 and Find Previous Signal 680 is called to attempt to cover the remaining portion as shown.

4. Find Previous Edge (FIG. 9)

At this stage in the method, and with reference to FIG. 6, the selected output signal being analyzed enters the Find Previous Edge routine 645 which is set forth in FIG. 9. The Find Previous Edge routine scans 900 the Available List file for all signals which have not been tagged. The routine then selects 910 those signals which have an edge one time unit prior to the first edge of the selected output signal. Hence, in FIG. 9, the routine gets the first signal from the Available List file and then ascertains 910 whether or not that signal has an edge one time unit prior to selected pulse. If there is no edge, another vector 930 is obtained from the list and the edge determination is once again made. However, if an edge is detected one time unit prior to the first edge of the selected output, that vector is added 920 to an options list for the Find Previous Edge routine.

An example of an options list is shown in FIG. 10 and constitutes one of the integer arrays in memory 320 of FIG. 3.

Figure 11:
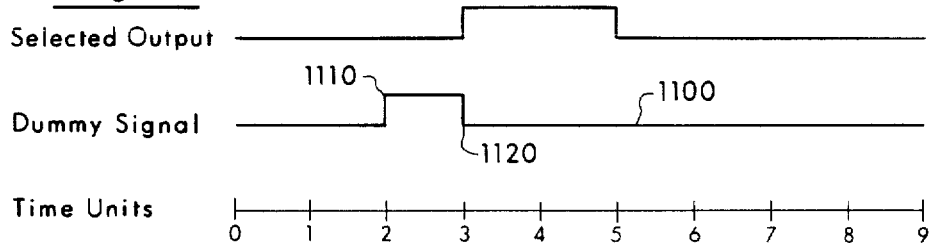
FIG. 11 sets forth the generation of a "dummy" error signal.

When all vectors have been analyzed and all vectors with an edge one time unit prior to the first edge of the selected output have been placed in the options list, the Find Previous Edge routine ascertains 940 whether the options list is empty. If the answer is yes that means no vector has been found with an edge prior in time to the first edge of the selected output. This is marked 950 as an error and control is passed over to the error block routine of FIG. 37 where a dummy signal is created. The dummy signal 1100 which is created and added as a new vector to the options list is shown in FIG. 11 and comprises a pulse having a first edge at 1110 and a second edge at 1120. The dummy signal is used to continue the process of waveform construction and for error reporting as will be discussed later.

Figure 12:
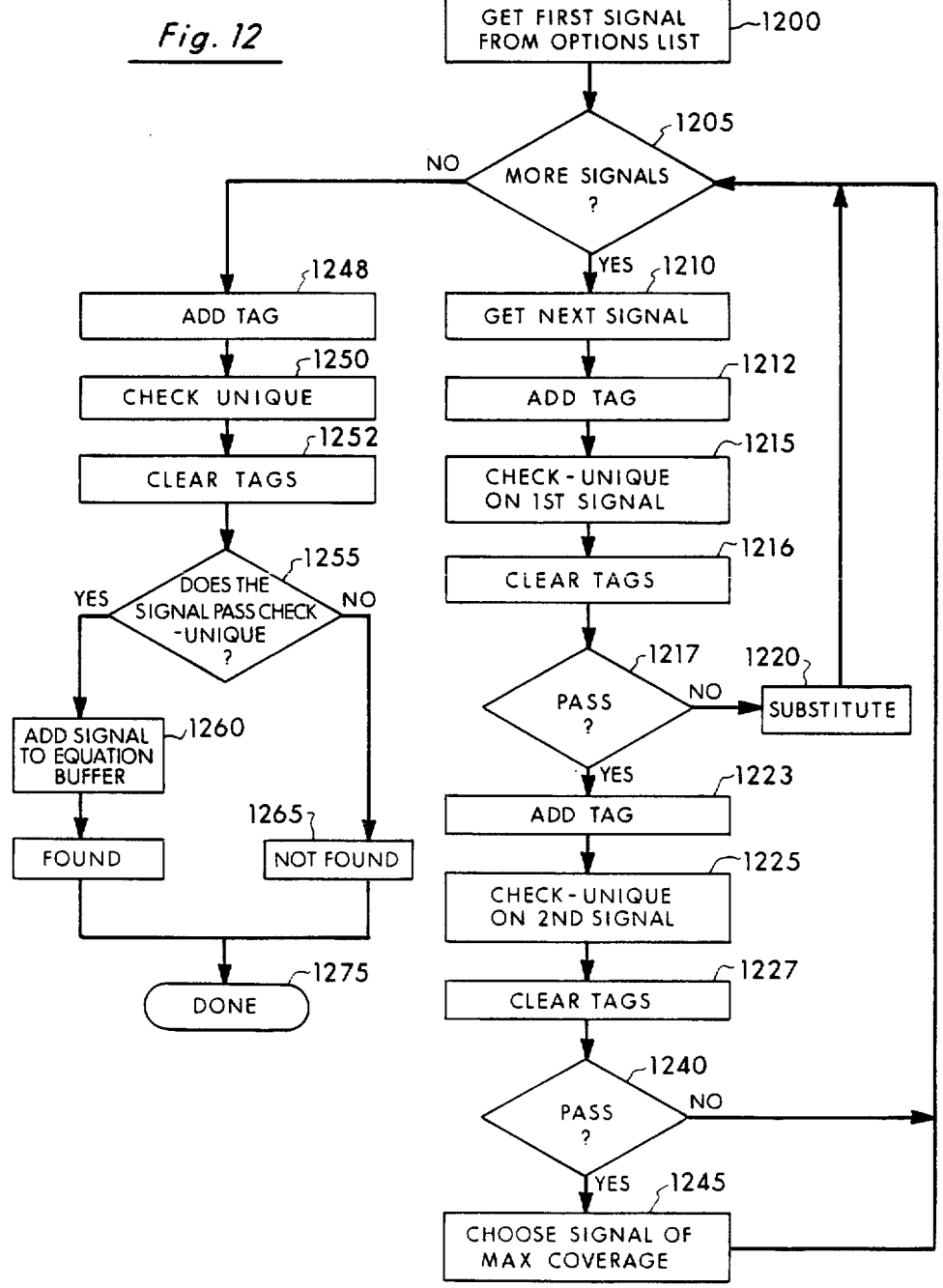
FIG. 12 sets forth the flow chart for the "Find Best" routine.

If the option list has an entry, the Find Previous Edge routine enters the Find Best Signal routine 960 of FIG. 12. As will be explained next, if a "best signal" was found 970, the Find Previous Edge routine adds 980 the signal found to the equations buffer of the Available List (FIG. 8) and then returns 990 to the Extract routine of FIG. 6 at point 650 of "ANDing/ORing" the signals. If a "best signal" has not been found, again a report 950 to the error block is made. The configuration of the error block which is also an integer array file in memory 320 is shown in FIG. 12. The name of the vector is entered as well as the message (for example, "NEED AN EDGE AT 150 ns."), the unit of time in the vector where the error occurred (150 ns), and the type of error (FIND PREVIOUS).

5. Find Best Signal (FIG. 12)

In FIG. 12 is set forth the Find Best routine 960. The routine gets 1200 the first signal from the options list and ascertains 1205 whether or not there are more signals in the list. If so, it then gets the next signal 1210. At this point, two signals from the options list have been selected. The routine then checks uniqueness on the first signal by entering the Check Unique routine 1215 shown in FIG. 14. In FIG. 12, if the first descriptor signal or waveform does not pass 1217 Check Unique 1215, the second signal earlier selected is substituted 1220 for the first and a new second signal 1210 is selected from the options list. This continues until the first signal passes 1217 Check Unique.

The system then analyzes 1225 the second signal to ascertain whether it passes Check Unique 1240. If not, the next signal in the options list is selected and checked. This continues until the second signal passes Check Unique. Finally, two descriptor waveforms have been selected wherein both descriptor waveforms pass Check Unique. As shown at stages 1215, 1225, and 1250, before entering Check Unique tags are added to the options list for the signal entering Check Unique and the tag is cleared after leaving Check Unique.

Figure 19:
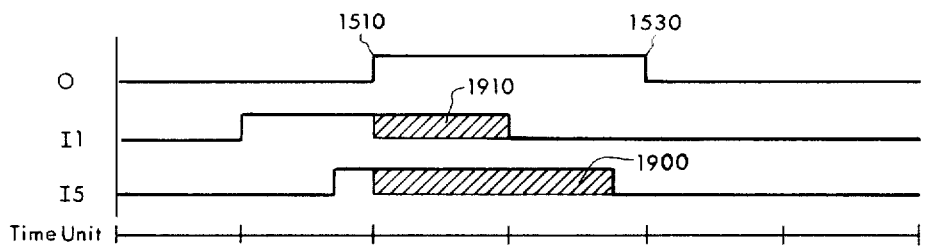
FIG. 19 illustrates the overlap between two "Unique" waveforms and the selected output.

The method then chooses the signal of maximum coverage 1245 of the selected output signal. This is shown in FIG. 19 where two descriptor waveforms I1 and I5 each passed Check Unique. Of the two signals, I5 has more overlap 1900 with the selected output than signal I1 shown by 1910. Hence, signal I5 is chosen and the routine returns to retrieve 1205 any more signals in the options list. This process continues until all signals in the options list have been processed. If there are no more signals, then it again returns to Check Unique but at stage 1250. Clearly, a "descriptor" signal that is chosen at 1245 will pass 1255 the Check Unique stage. This signal is then added 1260 to the equations buffer of the options list of FIG. 10.

Figure 36:
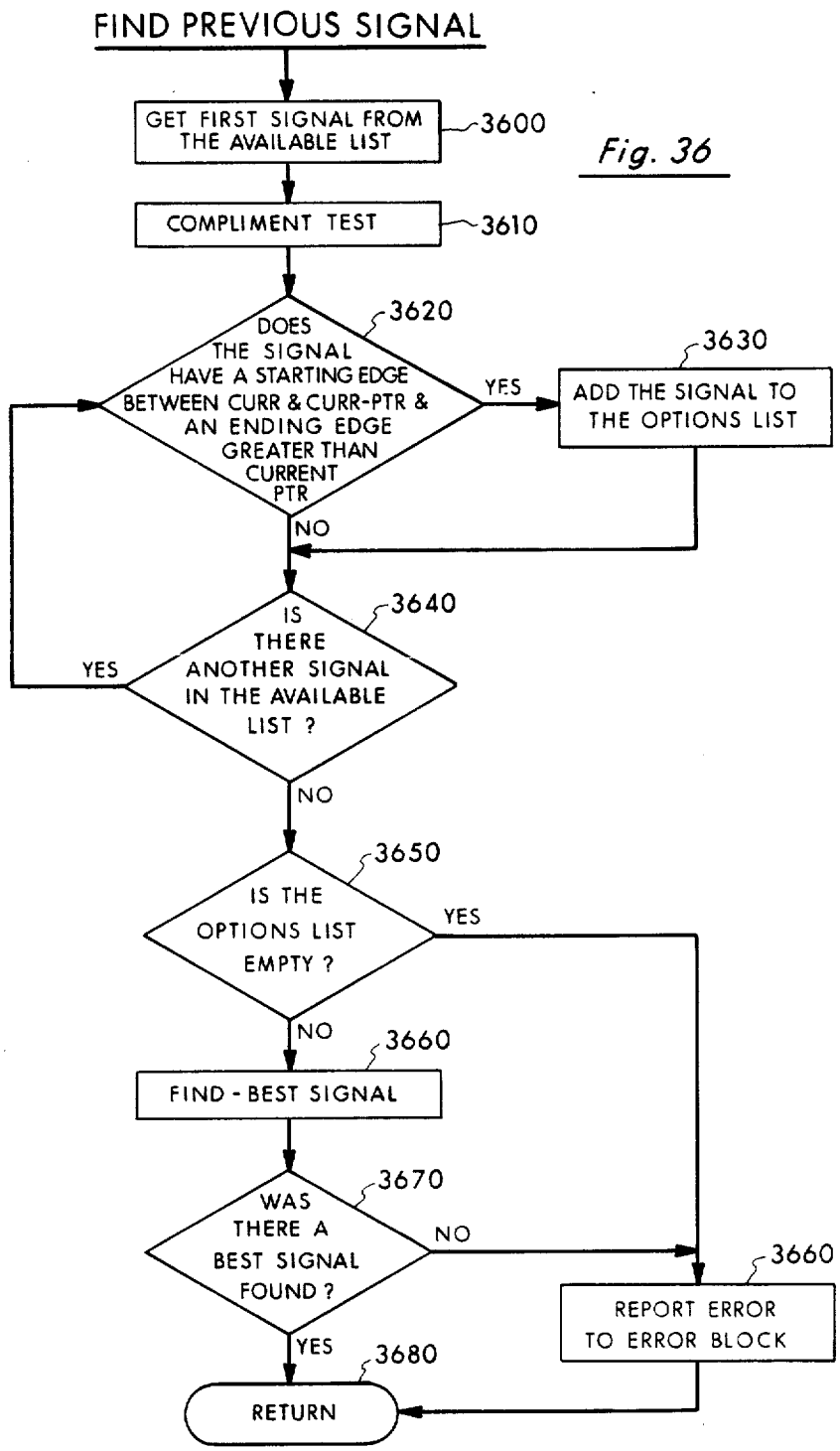
FIG. 36 is the flow chart for the "Find Previous Signal" routine.

For example, in FIG. 19, signal I5 would be added to the equation buffer as shown in FIG. 10. Hence, as shown in FIG. 10, the equation buffer includes an index for the selected output vector 0 that points to vector I5. This information states that of all of the other vectors in the Available List file that may be unique (other than those tagged), only I5 has the most overlap with the selected output signal. After adding 1260 the information to the equations buffer, the routine returns 1275 to the calling routine which may be: Find Previous Edge at 960 (FIG. 9), Find Unique Previous at 2035 (FIG. 20), Find Unique End at 2665 (FIG. 26), Find Unique End at 2875 (FIG. 28), and Final Previous Signal at 3660 (FIG. 36).

In the event, however, that the Find Best routine does not find any signal in the vector list which is unique, the Check Unique stage 1250 of FIG. 12 ascertains that the signal is not unique and that a best signal was not found. In this event, the routine also returns 1265 to the calling routine.

In FIG. 9, if a best signal was found, the equation for the signal 980 is added to the equations buffer in the Available List of FIG. 8 and the routine returns to its caller. This is shown in FIG. 8, the options list of FIG. 10 is no longer used. If a Best signal was not found, a report 950 is made to the Error Block as described with respect to FIG. 37 and the routine returns.

6. Check Unique (FIG. 14)

In the Check Unique routine, three conditions must be satisfied. These conditions are Unique Previous, Unique End, and Unique After.

Figure 14:
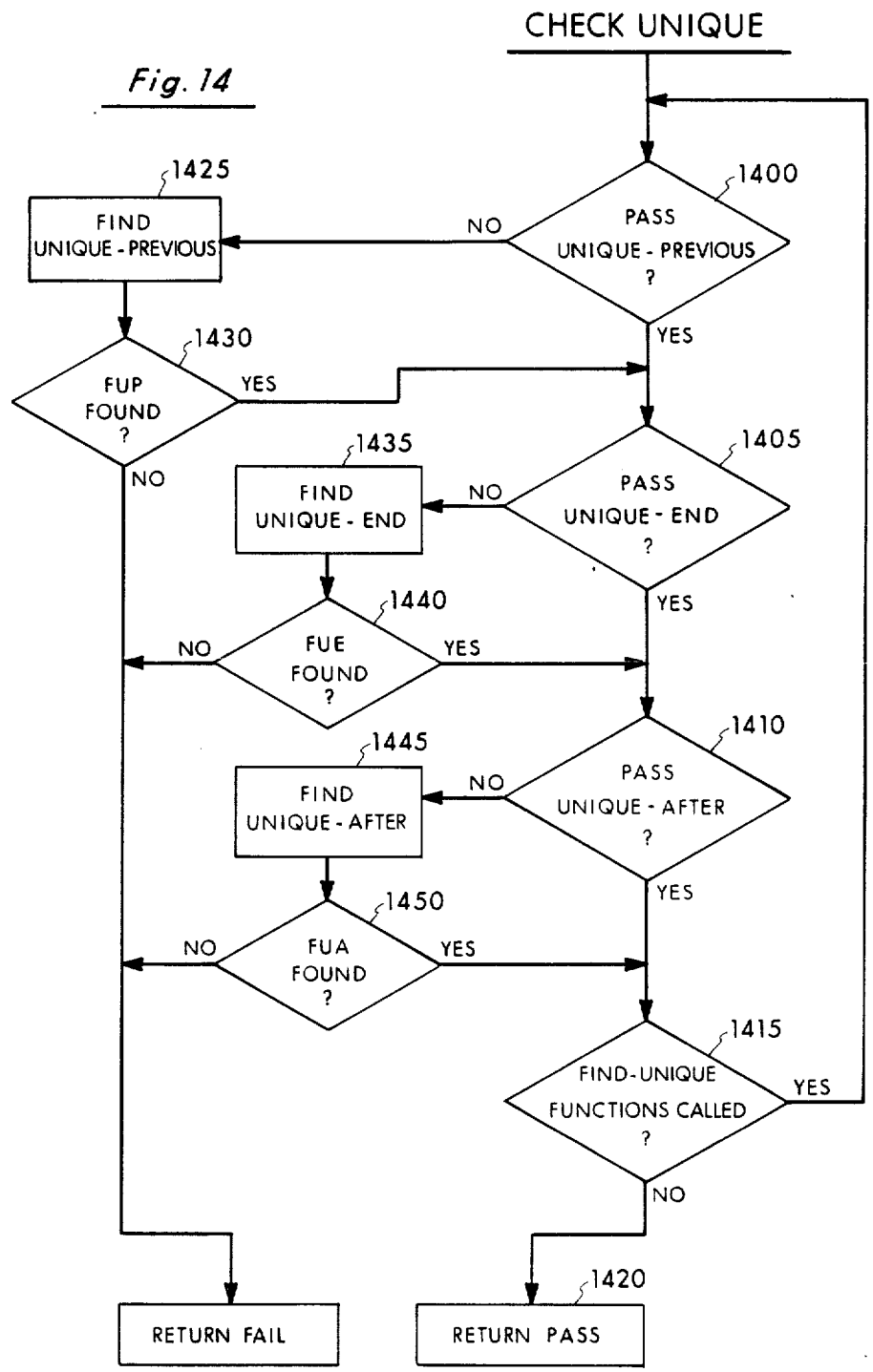
FIG. 14 is the flow chart for the "Check Unique" routine.
Figure 15:
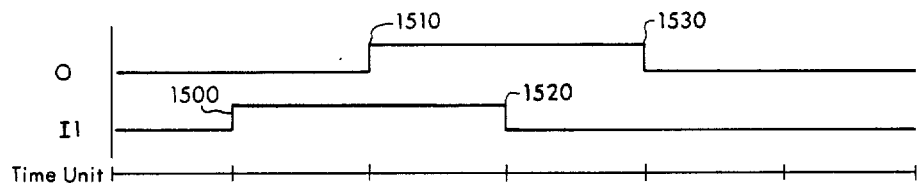
FIG. 15 illustrates a waveform passing the three conditions of Unique Previous, Unique End, and Unique After.
Figure 16:
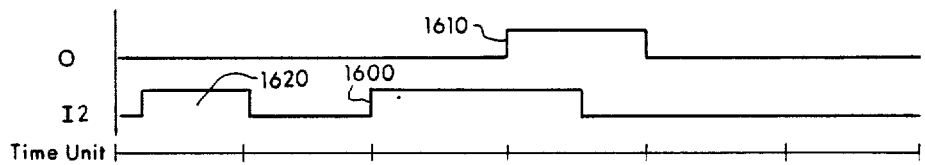
FIG. 16 illustrates a "Non-unique Previous" waveform.
Figure 17:
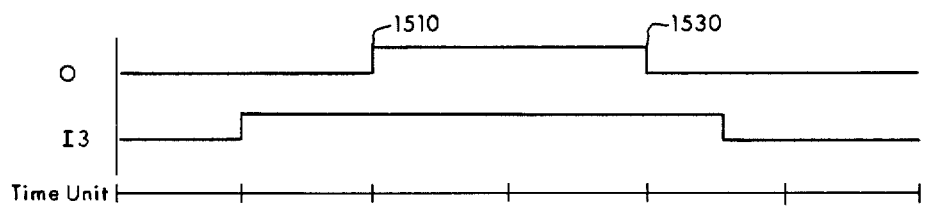
FIG. 17 illustrates a "Non-unique End" waveform.

In FIG. 14 the Unique Previous determination 1400 requires that a waveform output must have an edge one-time unit previous to the first edge of the selected output signal. However, the waveform cannot transition prior to that edge (i.e., while the selected output is in a nonasserted state). FIG. 15 depicts a waveform I1 that has an edge 1500 one-time unit before the first edge 1510 of the selected output signal 0 and therefore passes the Unique Previous test. FIG. 16 shows a waveform I2 that fails the Unique Previous condition since although waveform I2 has an edge 1600 one-time unit prior to the first edge 1610 of the selected output 0, it has a transition 1620 earlier than edge 1600 while the selected output is non-asserted.

If a signal such as I1 of FIG. 15 passes this test, then it is checked against Unique End condition 1405. Under this condition, the waveform must end before the selected output pulse ends. In FIG. 15, pulse I1 ends at 1520 before the output pulse ends at 1530. To pass this condition, the input pulse I1 must end between the CURRENT EDGE 1510 of the output pulse and the NEXT EDGE 1530 of the output pulse. Signal I1 passes this test. In FIG. 16, the descriptor pulse I3 ends outside of the output pulse and, therefore, constitutes a "nonUnique" end waveform.

Figure 18:
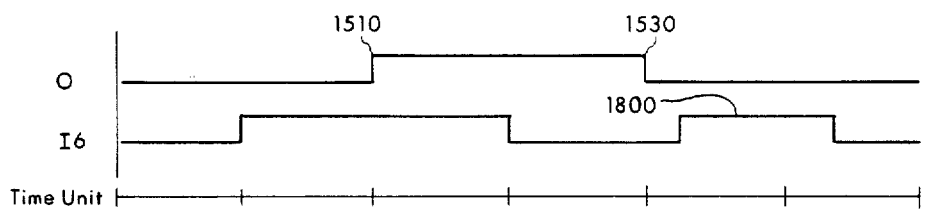
FIG. 18 illustrates a "Non-unique After" waveform.

Upon completion of the Unique End test 1405, if the waveform such as I1 passes, the third condition that must be met is the Unique After test 1410. This means that outside (i.e. before and after the pulse) the first pulse of the selected output, the Unique After condition requires that the descriptor waveform must remain in a non-asserted state up to one time unit before the output again becomes asserted anywhere outside the non-asserted pulse. If the selected output stays in a nonasserted state, the descriptor waveform must also remain non-asserted. FIG. 15 shows a descriptor waveform I1 which satisfies this condition. However, FIG. 18 shows a waveform I6 which fails the Unique After test. Note that waveform I6 of FIG. 18 passes the Unique Previous and Unique End criteria. Waveform I6, however, becomes asserted with pulse 1800 where selected output 0 stays unasserted. Thus, making it non-Unique After.

While the examples of FIGS. 15, 16, 17, and 18 have shown the Check Unique routine for a single pulse of the selected output, it is to be expressly understood that all pulses of the selected output and all pulses of the descriptor waveform must satisfy all three conditions. The Check Unique routine can be used to ascertain Uniqueness, as discussed above, independently of the Extract routine and is used, in the preferred embodiment in the sequence shown.

In the above example, it was assumed that the waveform passed the three conditions of Unique Previous, Unique End, and Unique After of the Check Unique routine in FIG. 14. In the following, the discussion occurs when one of these conditions fails. If any of the Unique conditions failed, then the corresponding Find Unique will be called as explained next, but at point 1415 the process of checking Unique for all three conditions is repeated.

7. Find Unique Previous (FIG. 20)

Figure 20:
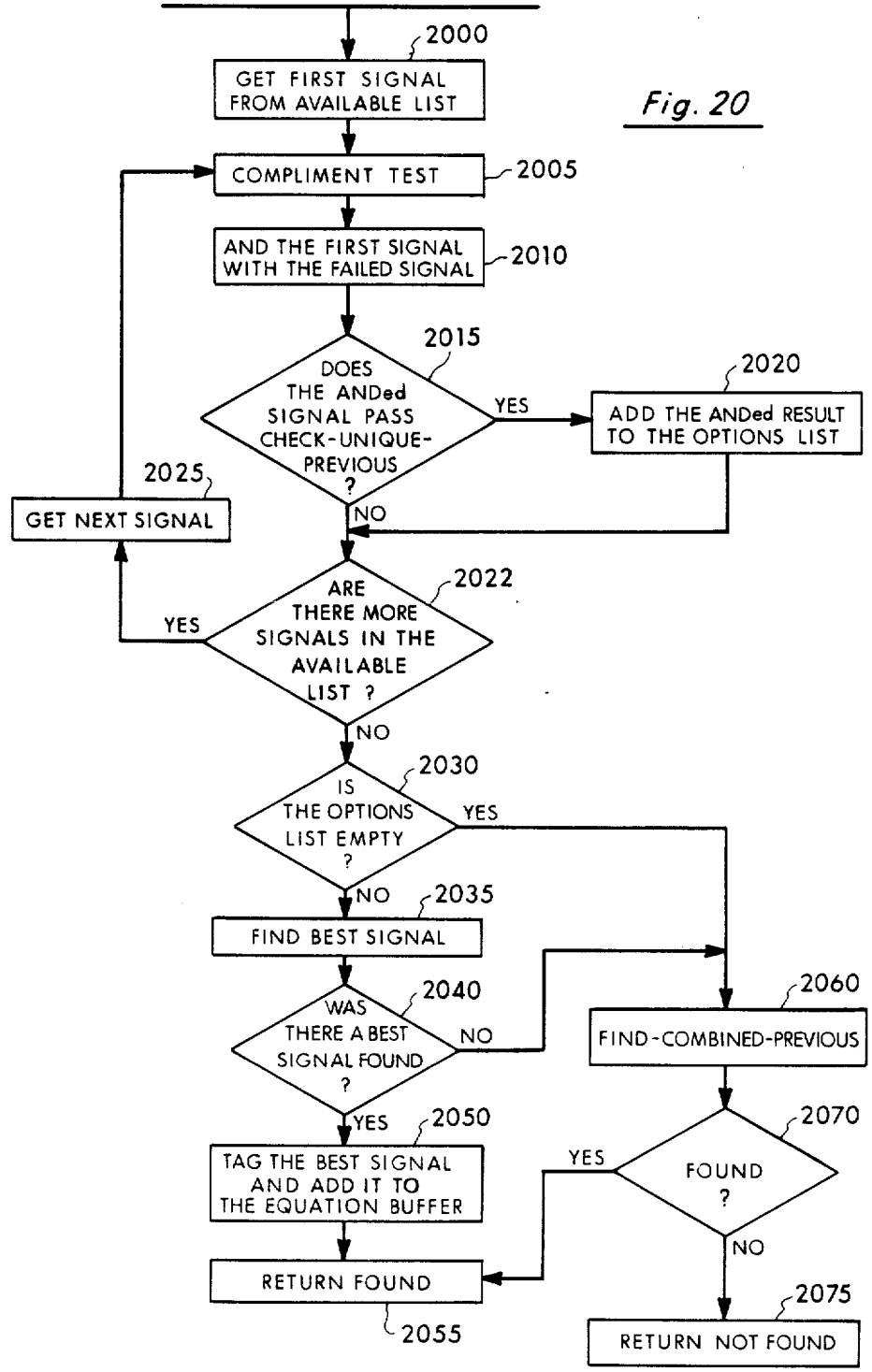
FIG. 20 sets forth the flow chart for the "Find Unique Previous" routine.

In FIG. 14, if the waveform fails to pass 1400 the Unique Previous condition, it enters the Find Unique Previous 1425 routine which is set forth in FIG. 20.

The routine gets 2000 the first signal from the Available List file. This signal is then ANDed 2010 with the failed signal from the prior Unique Previous 1400 routine. For example, and with reference to FIG. 21, it is desired to write an equation for the selected output 0. However, waveform I1 failed to pass the Unique Previous routine 1400 and that waveform is now delivered to the Find Unique Previous routine of FIG. 20. The first signal in the Available List is signal I2 and that signal, I2, undergoes a compliment test. At point 2100 on waveform I1, signal I2 must also be high. The compliment test determines that signal I2 is not high when 0 is asserted and, therefore, compliments signal I2 as shown by /I2 in FIG. 21 in order to make it high at point 2100. Complimented signal I2 is now ANDed with the failed signal I1 to result in a new signal, I1*/I2, having an edge 2130 shown in FIG. 21 which precedes the edge 2120 as shown by indicator arrow 2110.

Figure 21:
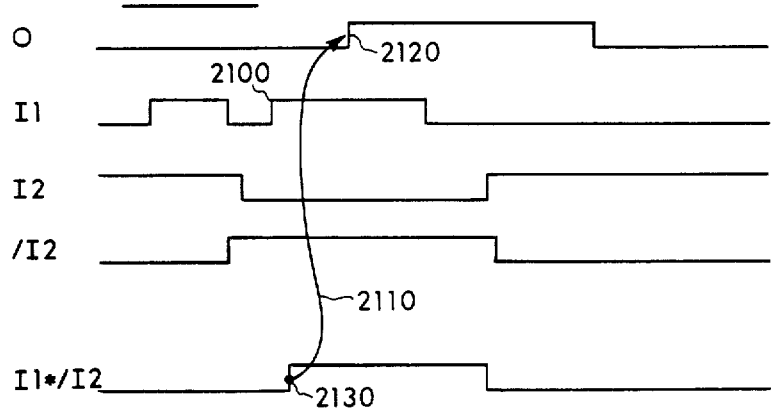
FIG. 21 illustrates the creation of a waveform that satisfies the "Unique Previous" condition.

The question 2015 is now asked as to whether or not the ANDed combination passes the Check Unique Previous routine. In the example of FIG. 21, I1 when ANDed with the compliment of I2 passes the Unique Previous condition and the ANDed result is added 2020 to the options list. This process continues 2022 and 2025 until all signals in the Available List are examined. Hence, at this point 2030, the routine has found all possible combinations that will pass Check Unique Previous. As before, if more than one possible "ANDed" combination is found, the Find Best routine 2035 of FIG. 12 (See Section 5) is entered in order to find the signal passing all 3 conditions and having the most overlap. If a Best signal is found 2040 then the Best signal is tagged 2050 and added to the equations buffer of the options list created before the last call to Find Best.

Figure 22:
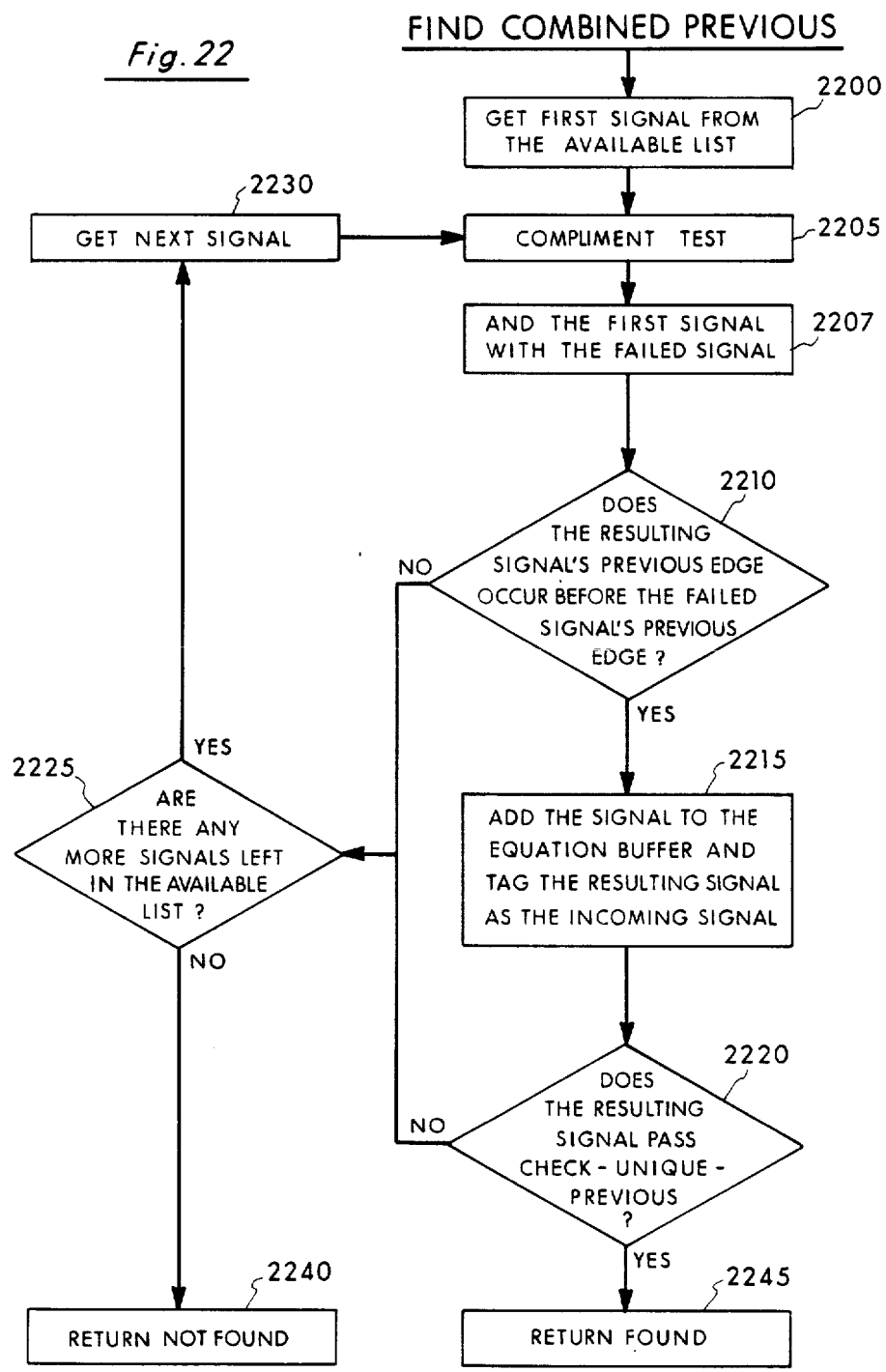
FIG. 22 sets forth the flow chart for the "Find Combined Previous" routine.

The routine returns 2055 to Find Unique Previous (FUP) Found 1430 of FIG. 14. If a Best signal is not found or if the options list is empty, the Find Combined Previous routine 2060 of FIG. 22 is entered. If routine 2060 does not find 2070 a signal, then a return "not found" 2075 occurs.

8. Find Combined Previous (FIG. 22)

Figure 23:
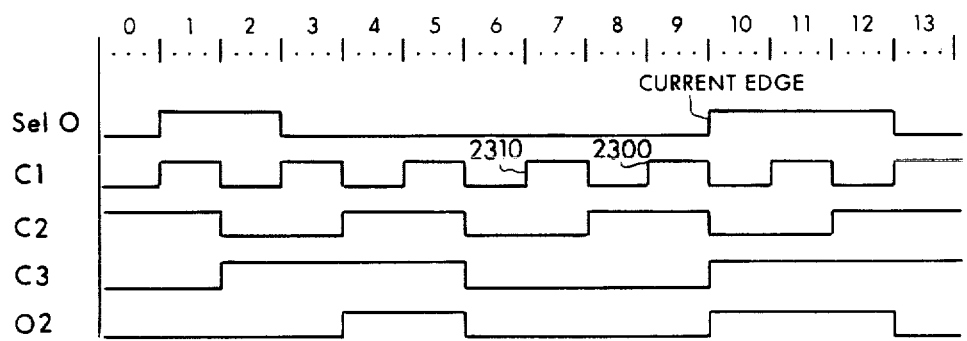
FIG. 23 sets forth a waveform that does not satisfy the "Unique Previous" condition.
Figure 24:
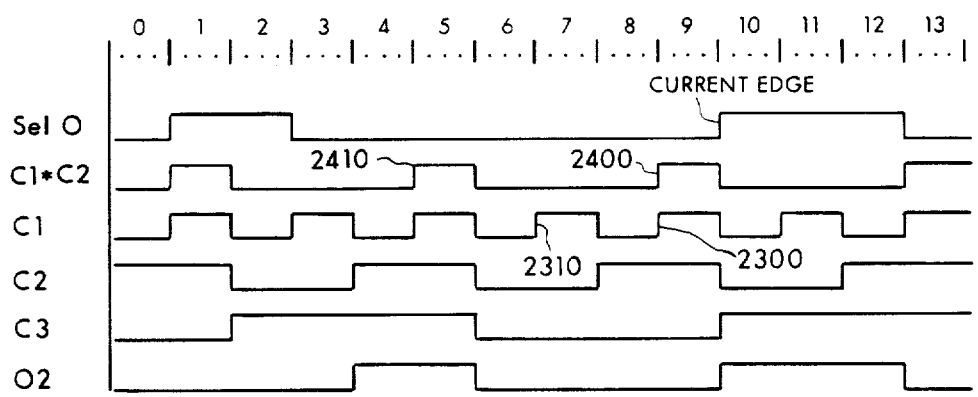
FIG. 24 sets forth a second combined waveform that does not satisfy the "Unique Previous" condition.

If no single signal is found by Find Best to pass the Unique Previous Condition the Find Combined Previous routine of FIG. 22 tries to find a combination of signals that ANDed with the incoming signal will make it pass the Unique Previous condition. Here the first signal from the Available List is obtained 2200 and as before a compliment test 2205 is performed. As shown in FIG. 23, the selected output 0 represents the waveform that requires a Boolean equation. Waveform C1 is the failed signal from the Find Unique Previous routine 1400 and waveform C2 represents the first signal from the Available List. As before, the compliment test 2205 determines that signal C2 is high at edge 2300 and therefore does not compliment signal C2. Signals C1 and C2 are ANDed together as shown in FIG. 24. In FIG. 23, the incoming signal C1 has a previous edge but is not unique. Neither are there any other signals in the system that when ANDed with C1 will generate a Unique Previous signal. As shown in FIG. 24, the ANDing of signal C1 with C2 results in a signal that still has an edge 2400 that is one time unit prior to the current edge of the selected output. The C1*C2 signal has a previous edge 2410 earlier in time than the original signal C1 at 2310. As shown, the non-unique Edge 2310 of C1 happens at time interval 7 whereas the non-unique edge 2410 of the combination C1 and C2 happens at time interval 5.

Hence, the routine ascertains whether the resulting signal's non-unique edge occurs 2210 before the failed signal's non-unique edge. The signal is then added 2215 to the equations buffer of the options list and tagged as a good signal thereby withdrawing it from further consideration. However, as shown in FIG. 24, the resulting C1*C2 signal does not pass 2220 the Check Unique Previous condition and therefore the question is asked whether there are any more signals 2225 left in the Available List and if so, the next signal 2230 is retrieved. If not, then a return "not found" 2240 occurs.

Figure 25:
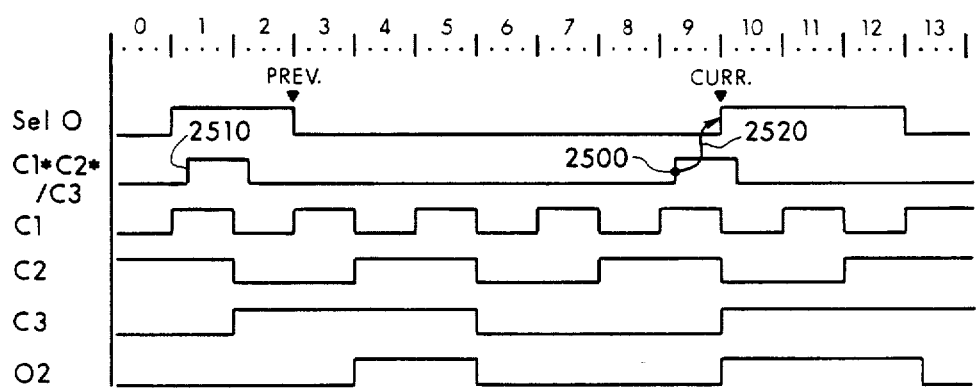
FIG. 25 sets forth a third combined waveform that satisfies the "Unique Previous" condition.

This is shown by reference to FIG. 25 where the next available signal is C3. At time 2500 signal C3 is low and therefore the compliment test of 2205 inverts C3 and ANDs 2207 the compliment of C3 with C1 and C2 as shown in FIG. 25. The C1*C2*/C3 combination will move the non-unique edge 2510 of the resulting signal much earlier in time where the selected output 0 is asserted thus making the resulting signal Unique Previous. The combination will have a previous edge 2500 one time unit prior to the current edge as shown by indicator arrow 2520. In this case, the signal passes Check Unique Previous 2220 and a return "found" 2245 occurs.

9. Find Unique End (FIG. 26)

Figure 26:
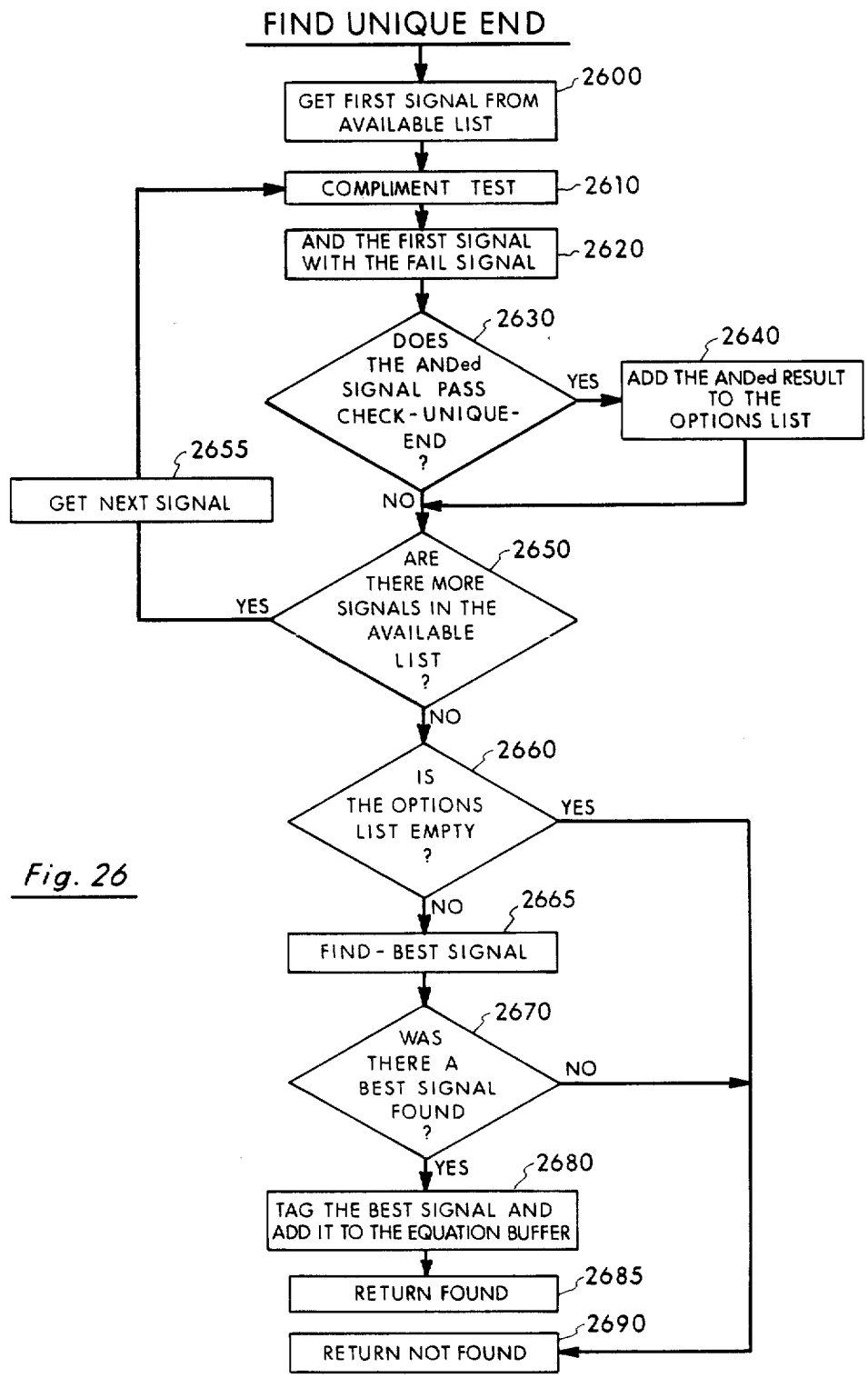
FIG. 26 sets forth the flow chart for "Find Unique End" routine.

Returning to the FIG. 14, if a descriptor signal passes Unique Previous 1400 but fails to pass Unique End 1405 it enters the Find Unique End routine 1435 shown in FIG. 26.

Figure 27:
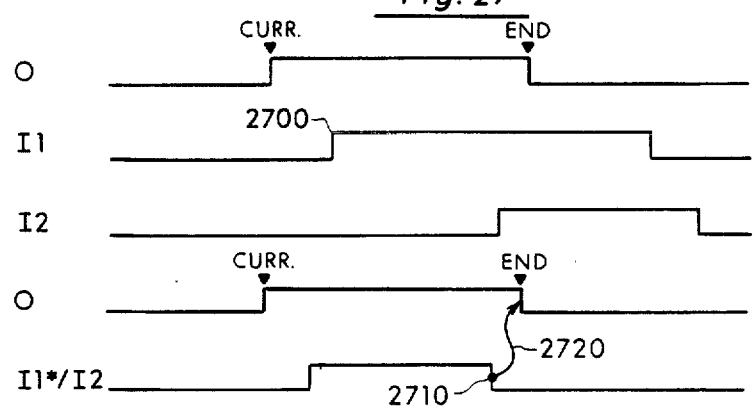
FIG. 27 is a waveform illustrating the "Unique End" condition.

For example, in FIG. 27, the selected output signal 0 is shown with the failed signal I1. In FIG. 26 a new first signal, e.g., I2 of FIG. 27, is obtained 2600 from the Available List and is tested for compliment at time 2700. As shown, the signal I2 is low and therefore must be complimented by step 2610. I1 and the compliment of I2 are ANDed 2620 together to create a signal having an end 2710 at least one time unit prior to the END of the selected output 0 as shown by indicator 2720. If it possesses a Unique End 2630 it is added to the options list at step 2640 and then a determination is made if there are any more signals 2650 in the list and if so, at 2655, the process repeats. Once all the signals in the Available List are utilized, the question at 2660 is asked as to whether or not the options list is empty. If it is empty, nothing has been found and it returns (Not Found 2690) to the Find Unique End (FUE) Not Found 1440 of FIG. 14. If the options list contains entries, the Find Best routine is entered and at stage 2670, if a Best signal has been found, it is tagged 2680 and a found is returned 2685.

It can therefore be seen that in the event incoming signal does not have a Unique End condition, the routine Find Unique End ANDs the failed signal with all available signals, one at a time. If any of the resulting signals have a Unique End condition, the combined signal is a candidate for describing the selected output. Find Unique End makes a list of the candidate signals and passes the list of the incoming signals ANDed with the candidates to Find Best. The signal returned by Find Best is added to the equation buffer and the selected signals corresponding tag is set thus removing it from the Available List. A return "found" 2685 occurs.

10. Find Unique After (FIG. 28).

Figure 28:
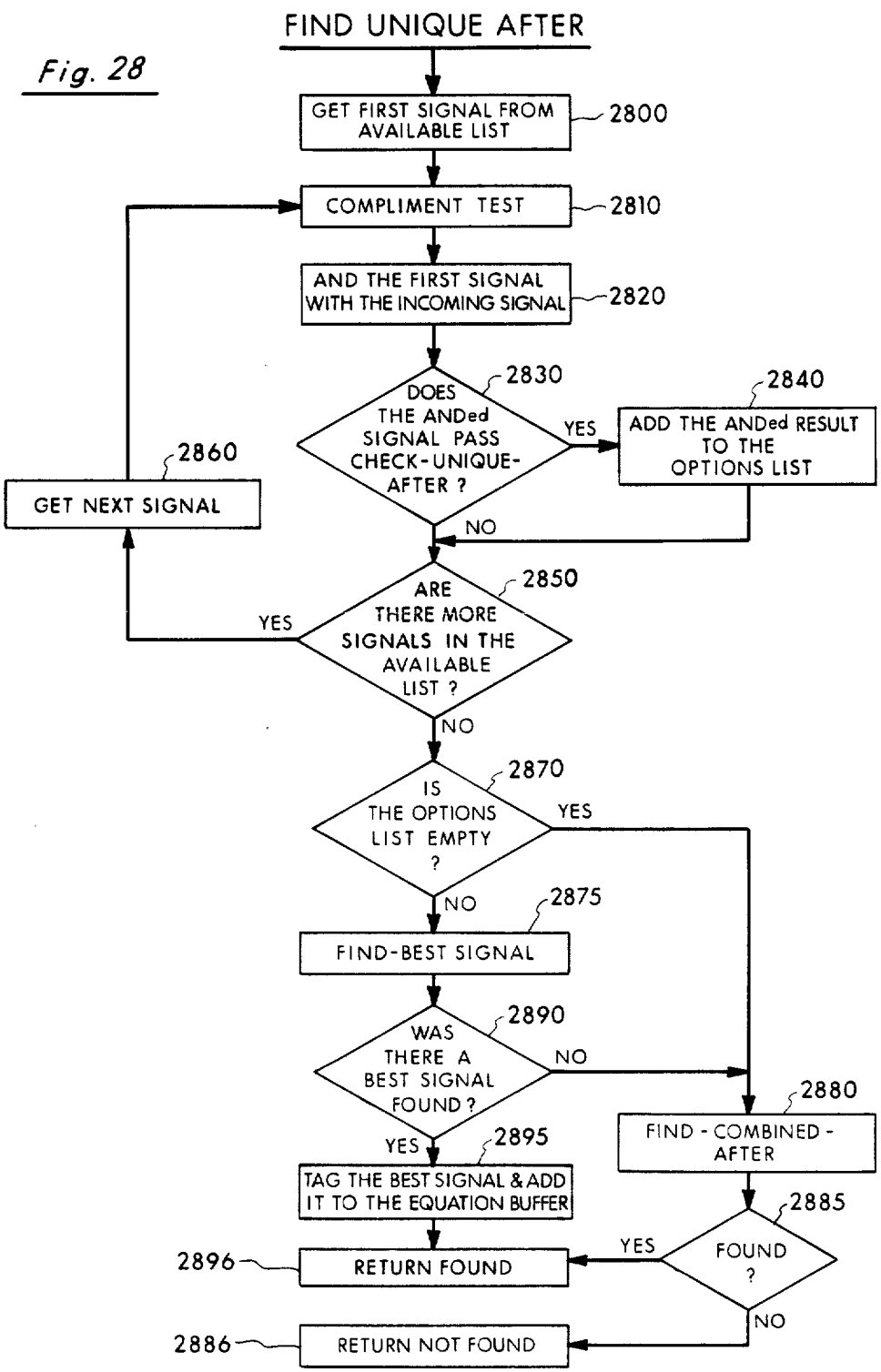
FIG. 28 is the flow chart for "Find Unique After" routine.

Returning to FIG. 14, if a given signal passes the Unique Previous 1400 and the Unique End 1405, but fails the Unique After, the Find Unique After routine 1445 is entered and is shown in FIG. 28.

Figure 29:
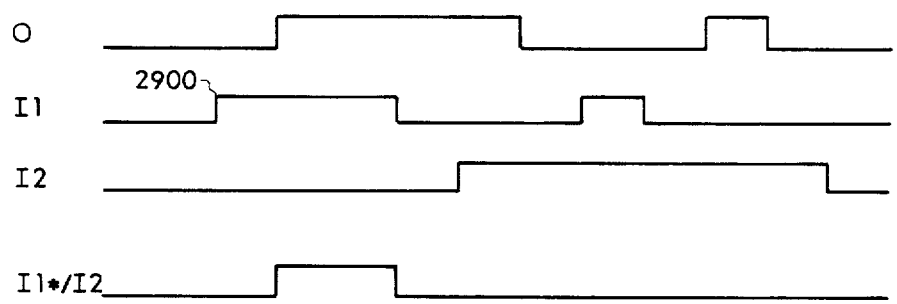
FIG. 29 is a waveform illustrating the "Unique After" condition.

The first signal is obtained from the Available List 2800 and is tested for the compliment. As shown in FIG. 29, the failed signal is I1 and the first signal from the Available List is I2. Compliment test 2810 at point 2900 shows I2 to be low and therefore the compliment of I2 is made. The first selected signal is now ANDed with the failed or incoming signal I1 at stage 2820. As shown in FIG. 29, the resulting I1*/I2 signal passes the Unique After at stage 2830 and is added to the options list at 2840. If there are more signals in the Available List 2850, the next signal 2860 is obtained and the process continues until all combinations that have a Unique After are identified and they are set forth in the options list. A test is then done on the options list at 2870 to ascertain whether the list is empty. If it is, the Find Combined After routine 2880 is entered and if the list is not empty, the Best Signal is found and if one was found, the Best signal is tagged and added to the equations buffer at 2895. The routine then returns "found" 2896 to FIG. 14 at 1450. If none is found 2885, then a return "not found" 2886 occurs.

Therefore, the Find Unique After routine assumes that the incoming or failed signal does not have a unique after condition. Find Unique After ANDs the incoming signal with all the available signals, one at a time. If any of the resulting signals have a Unique After condition, that signal is a candidate for describing the selected output. Find Unique After makes a list of the candidate signals and passes the list of the resulting signals ANDed with the candidates to Find Best. The signal returned by Find Best is added to the equations buffer. The selected signal's corresponding tag in the Available List is set thereby removing it from further consideration.

11. Find Combined After (FIG. 30)

Figure 30:
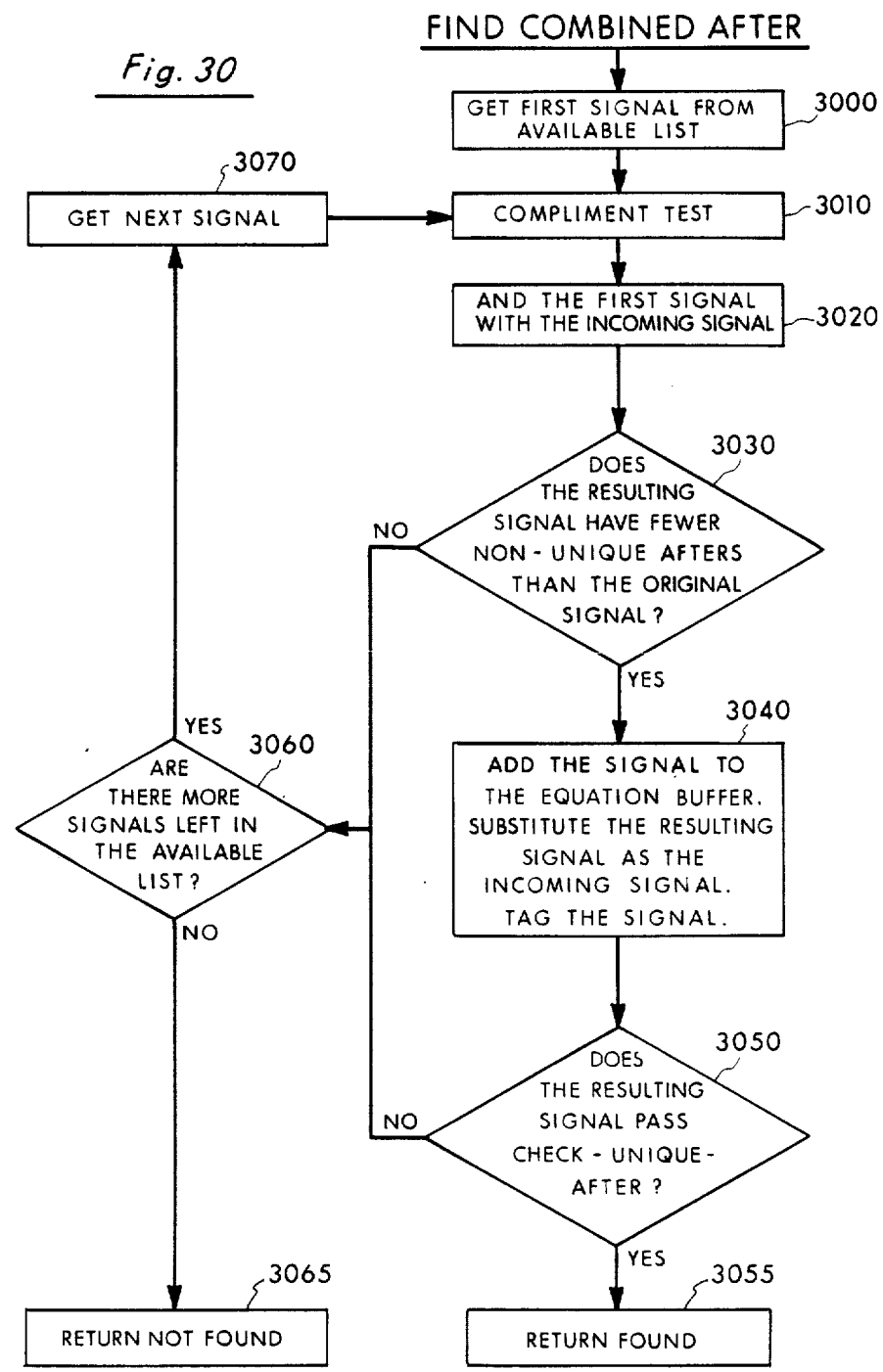
FIG. 30 is the flow chart for the "Find Combined After" routine.
Figure 31:
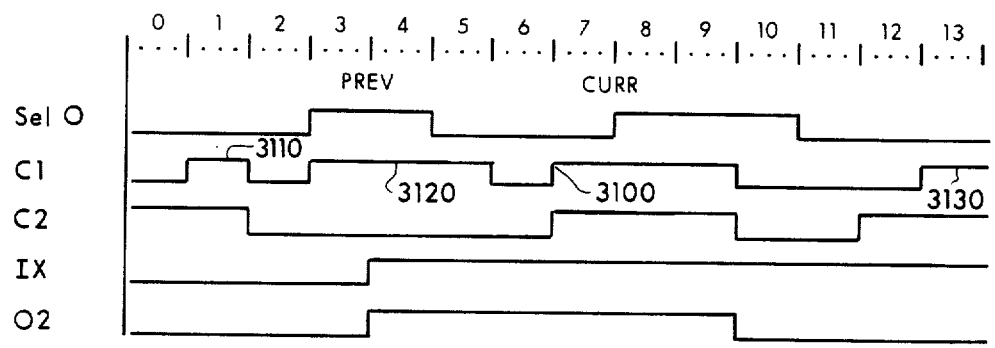
FIGS. 31 through 34 illustrate waveforms showing the "Combined Unique After" condition.
Figure 32:
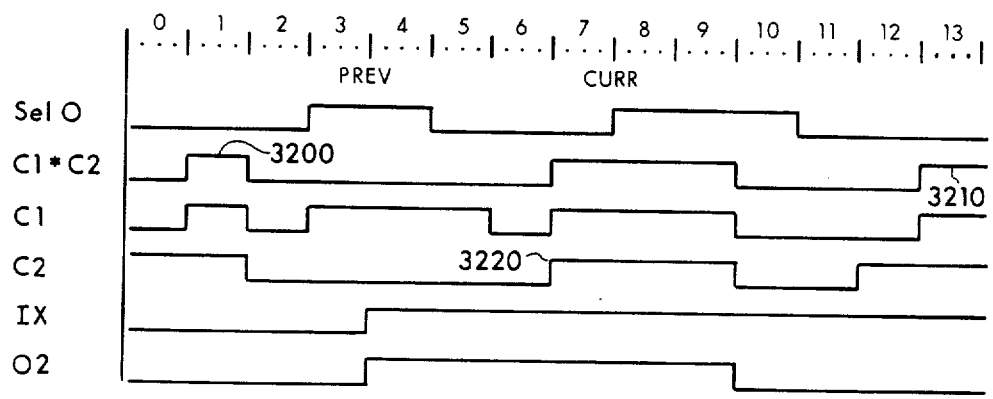
Figure 33:
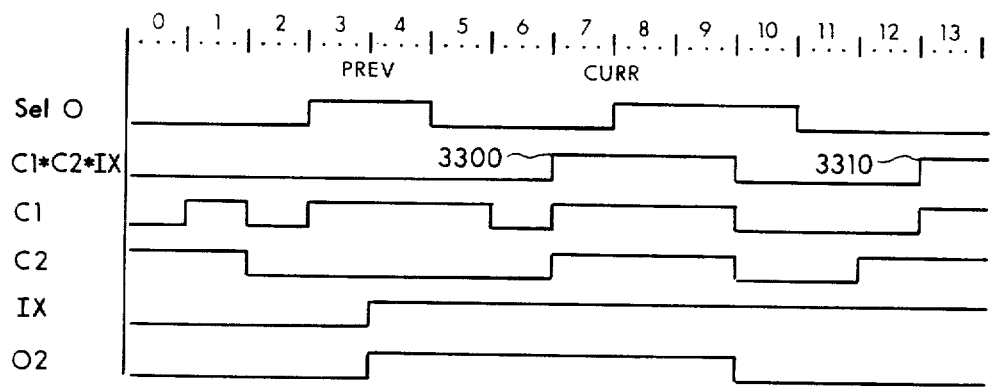
Figure 34:
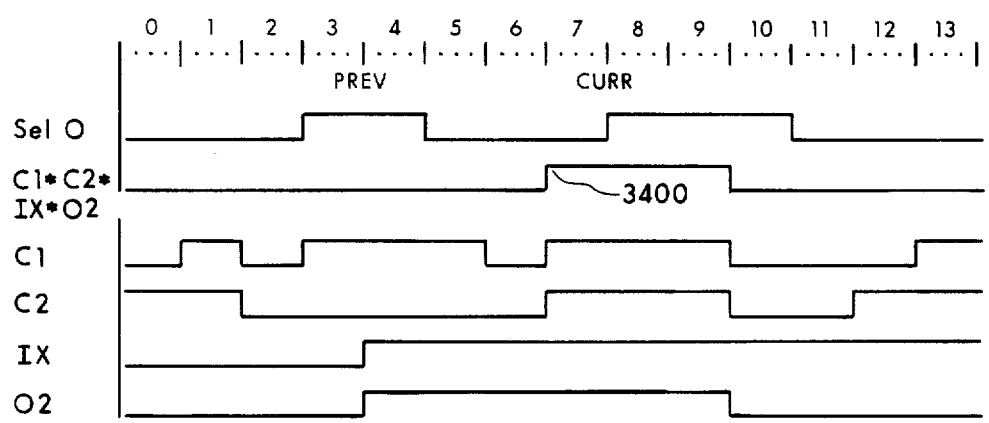

The Find Combined After routine is set forth in FIG. 30 and is explained in an example in FIG. 31. Find Combined After tries to find a combination of signals that ANDed with the incoming signal will make it pass the condition. For example in FIG. 31, for the selected output 0 there is an incoming signal C1 that fails the Unique After condition. The first signal from the Available List 3000 is signal C2 and the compliment test as shown at time 3100 passes. The first signal is then ANDed with the incoming signal at step 3020 and as shown in FIG. 32 C1*C2 product still fails the Unique After. The C1*C2 product at assertions 3200 and 3210 show two "after" failures whereas in FIG. 31 the C1 pulse at 3110, 3120 and 3130 has three "after" failures. The C1*C2 product as shown in FIG. 32 improves the "afters" by a reduction of one. Hence, in FIG. 30, if the resulting signal has fewer non-unique "afters" than the original signal at stage 3030, then stage 3040 is entered. The signal is added to the equations buffer and is tagged. If it still fails the Unique After Check at 3050, which the C1*C2 product would, it returns through stage 3060 to get the next signal at 3070 and to test it for the compliment. In this case, the third signal is IX, as shown in FIG. 32 at time 3220, passes the compliment test 3010 and signal IX is then ANDed with the C1*C2 product as shown in FIG. 33. The C1*C2*IX product still has a single failure at point 3310. Hence, stages 3030, 3040, 3050, 3060, and 3070 are repeated to retrieve the next signal from the Available List which in the example is signal 02. Signal 02 at point 3400 passes the compliment test 3010 and is ANDed to form a C1*C2*IX*02 product which passes the "Unique After" test.

As can be seen the Find Combined After ANDs the incoming signal with the applicable available signals. It continually seeks fewer and fewer nonunique afters in the original signal until, if possible, it passes 3050 the Unique After Condition.

At this point 3055, the routine returns to the Find-Combined-After of FIG. 28 at point 2880 to continue at 2885. If it does not pass 3050, then it returns "not found" 3065.

12. Find Previous Signal (FIG. 36)

This portion of the program scans the list of available signals for all signals which have a first edge between the first edge of the selected output and Current Time and having an end edge after the Current Time. Note that in FIG. 35, it is the area between the Current Pointer and "End minus one" that needs to filled in. Hence, the Find Previous Signal routine gets the first signal 3600 and conducts a compliment test 3610 at the Current Pointer time and, in the example of FIG. 35, I4 does not need to be complimented. The question is then ascertained at 3620 as to whether the signal has a starting edge between "Current" and "Current Pointer" and signal I4 has edge 3500. Then stage 3620 ascertains whether it has an ending edge 3510 after "Current Pointer". If it meets these two conditions, the signal is added to the list 3630. In FIG. 35 that the waveform becomes I4. The routine gets other signals from the Available List at stage 3640. Once all of the signals have been analyzed, the options list is interrogated at stage 3650 to see if it is empty. If it is empty then a report of an error to the error block is made at 3660. If it is not empty the Find Best Signal routine determines which waveform in the options list has the greatest amount of overlap at 3660. If a Best Signal is found at 3670 that is the end of the routine and it returns 3680 to stage 650 of FIG. 6. So I4 is ORed to the existing equation I1*I2*/I3 so the resulting equation becomes I1*I2*/I3+I4 as shown in FIG. 35.

In this fashion, the selected output is being constructed from the Current edge to the "End edge minus one" of the selected output. The next recursion 660-670-680 through Extract works from the Current Pointer Edge to the "End minus one" edge and continues this process until the selected output is fully reconstructed.

If "END minus one" equals the end of the resulting signal 660, then if another edge exists 685, the next edge of the output 690 is analyzed by Extract. If there is not another edge, then another signal 520 is obtained and the next output signal is scanned 500 for. Hence, this process repeats for all remaining output signals.

13. Error Block (FIG. 37)

Figures 37, 38:
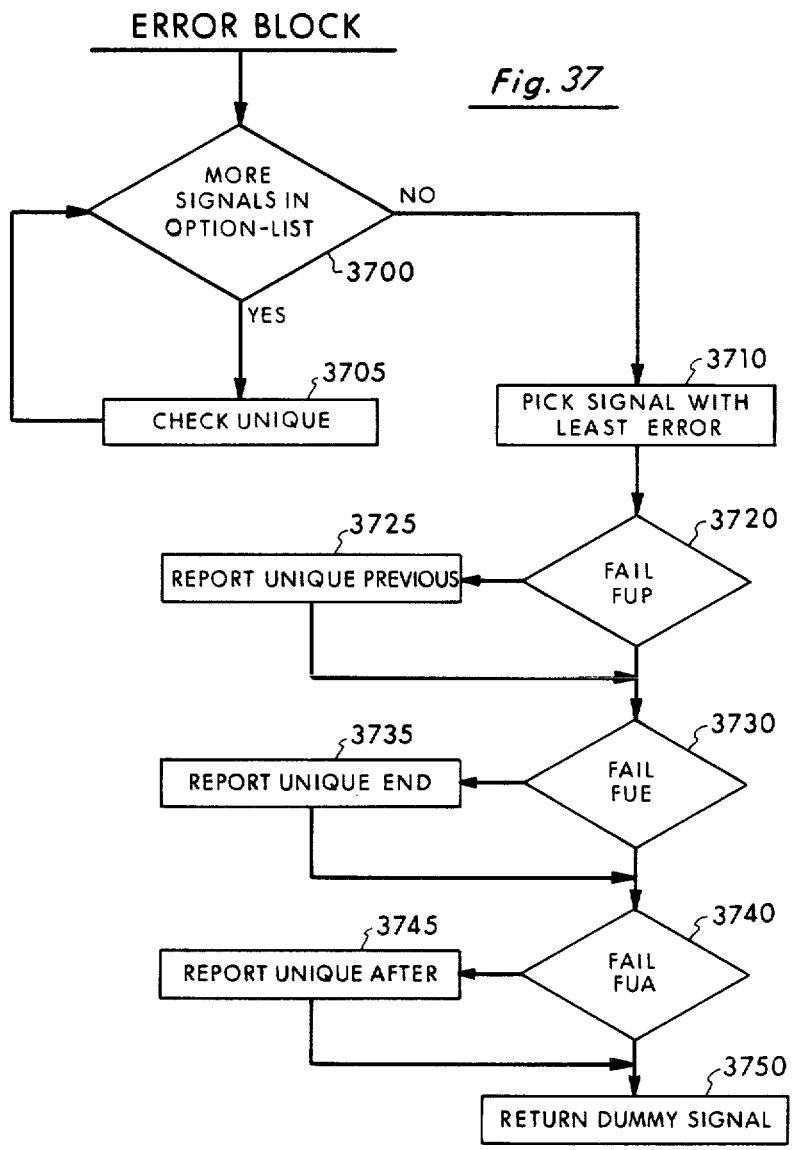
FIG. 37 is the flow chart for the "Error Block" routine.
FIG. 38 shows the "Error Block" format.

In the event that the error block routine is entered into at points 3660 of FIG. 36 or 950 of FIG. 9, the routine enters the error block of FIG. 37. When this occurs no signal is found in the Available List and an error occurs. At stage 3700, the current options list is checked to see if there are more signals in the options list. If there are, these signals are committed to the Check Unique subroutine 3705 of FIG. 14. The purpose of this check is to find which one of the signals fail which of the three conditions of Find Unique Previous, Find Unique End, and Find Unique After. If a signal fails all three conditions, then as shown in FIG. 38, that signal would have a one entered into each of the appropriate fields. Then at stage 3710, the signal in the options list with the least number of errors is selected and the identity of the error is determined in 3720, 3730 and 3740. For example, if the signal with the least error only failed Find Unique Previous (FUP), then a report 3725 is made as to the nature of the error and a dummy signal 3750 is generated. The same process occurs for Report Unique End 3735 and Report Unique After 3745.

The error information is reported as shown in FIGS. 11 and 13 and is used by the operator of the system to select or generate a new input signal to the system (i.e. "need a signal with edge at 150 ns"). If an error is reported, it means that the method of the present invention was unable to generate the selected output from the available signals.

14. Example of Operation (FIGS. 39 and 40)

Figure 39:
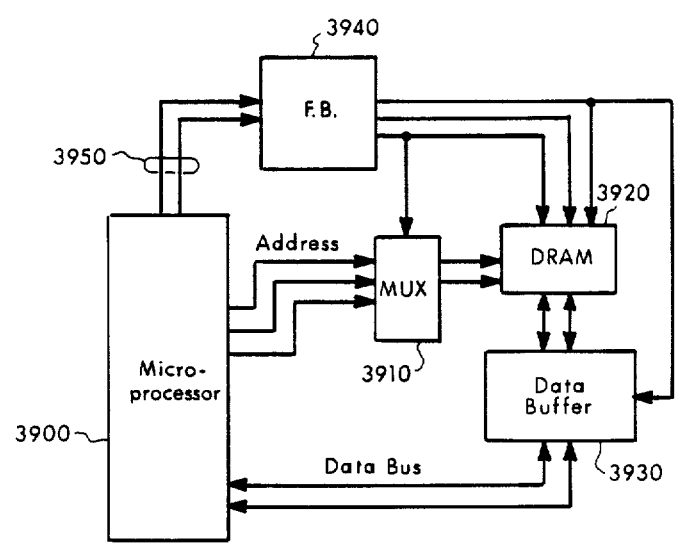
FIG. 39 sets forth an example digital system illustrating the design of an interface functional block (FB)
Figure 40:
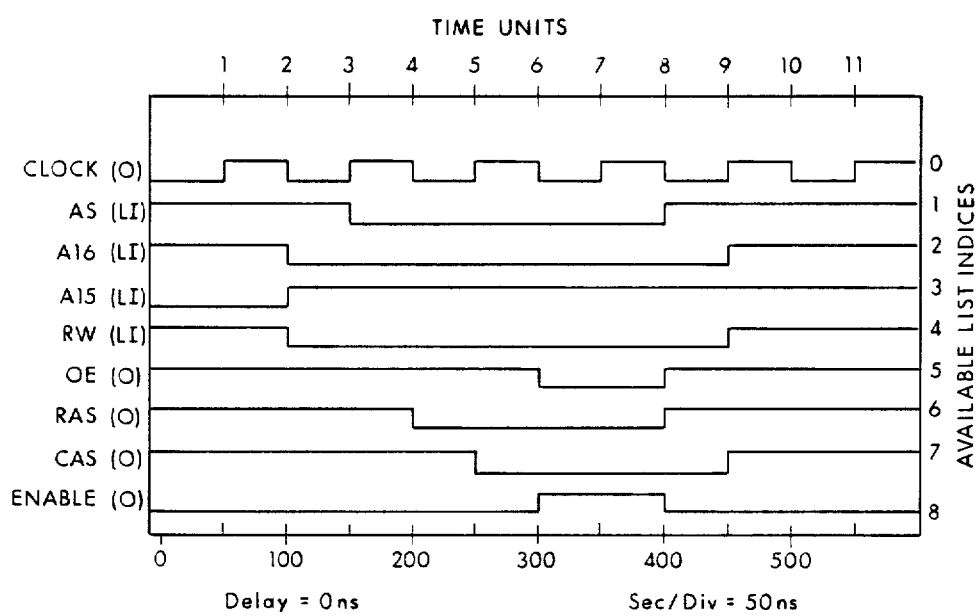
FIG. 40 sets forth the input and output waveforms of the FB of FIG. 39.

In FIGS. 39 and 40 is a sample waveform design. FIG. 39 shows a conventional microprocessor 3900 arrangement interconnected with a multiplexer (MUX) 3910, a dynamic random access memory (DRAM) 3920 and a data buffer 3930. It is desired to design a functional block 3940 which may be a PLD device whose internal design is to be programmed by the output of the present invention. Accessing the functional block 3940 are signals 3950 from the microprocessor which comprise read/write (RW), address strobe (AS), address bits (A15 and A16) and the clock. Coming from the functional block 3940 to the multiplexer 3910 is a row address strobe (RAS) and from the functional block 3940 to the DRAM 3920 are the RAS, column address strobe (CAS) and output enable (OE). From the functional block 3940 to the data buffer 3930 is the ENABLE signal.

FIG. 40 shows the screen displays entered into the input 310 of the system of the present invention shown in FIG. 3. It is now desired to program the functional block 3940 with the Boolean equations generated by the present invention to enable the processor to control the multiplexer 3910, the dynamic ram 3920, and the data buffer 3930.

In the following example, the Boolean equation necessary to construct the first part (i.e., from Current to Current Pointer) of the row address strobe (RAS) is discussed with reference to the method of the present invention.

The vector equivalents of the signals of FIG. 40 are shown in Table I below. This is the Available List stored in memory 320.

TABLE I

| INDEX | EQUATION BUFFER | TAG | VECTOR |
|---|---|---|---|
| 0 | | | CLOCK (0)L:1H:2,L:3 H:4,L:5,H:6,L:7,H:8, L:9,H:10,L:11,H:12 |
| 1 | | | AS(I) H:3,L:8,H:12 |
| 2 | | | A16(I) H:2,L:9,H:12 |
| 3 | | | A15(I) L:2,H:12 |
| 4 | | | RW(I) H:2,L:9,H:12 |
| 5 | | | OE(0) L:6,H:8,L:12 LOW-TRUE |
| 6 | | | RAS(0) L:4,H:8,L:12 LOW-TRUE |
| 7 | | | CAS(O) L:5,H:9,L:12 LOW-TRUE |
| 8 | | | ENABLE(O) L:6,H:8,L:12 |

Each of the recursive levels of the present invention will be presented for the evaluation of the selected output RAS.

First Level - Extract (FIG. 6) Output "RAS" is the selected output. RAS is not periodic 615-620, therefore none of the signals would be tagged.

1.a.: "RAS" starts out HIGH so it is inverted and a global flag LOW-TRUE is set.
1.b.: Current =Current-ptr =4 (time-unit)
1.c.: End =8 (time-unit)
1.d.: Call Find Previous Edge 645

Second Level - Find Previous Edge (FIG. 9)

Find all the signals with an edge 910 one time-unit prior to Current (i.e., signals that have an edge at 3), Create a new option list (below) and insert 920 signals O and /1 (i.e., clock and /AS) in it.

| INDEX | EQUATION BUFFER | VECTORS |
|---|---|---|
| 0 | | L:1,H:2,L:3,H:4,L:5,H:6, L:7,H:8,L:9,H:10,L:11, H:12 |
| /1 | | L:3,H:8,L:12 |

2.a. Call Find Best 960

Third Level - Find Best (FIG. 12)

Call Check Unique for all the signals in the options list
3.a.: Call Check Unique 1215 with 1st item in options list Fourth Level - Check Unique (FIG. 14)

Check to see if the signal passes all the unique conditions (Unique Previous, Unique After, and Unique End). If any fail call the appropriate routines Find Unique Previous 1425, Find Unique End 1435, and/or Find Unique After 1445 to fix the problem.
4.a.: Signal Index O does not meet Unique Previous 1400 condition, so call Find Unique Previous 1425.

Fifth Level - Find Unique Previous (FIG. 20)

The failed Incoming Signal is:

| 0 | L:1,H:2,L:3,H:4,L:5,H:6, L:7,H:8,L:9,H:10,L:11, H:12 |
|---|---|

AND 2010 the above signal with all signals not tagged in the Available List. If any of them pass Unique Previous 2015 condition add 2020 them to a newly created options list.

5.a.: AND Signal O with signal 0. The result will be: L:1,H:2,L:3,H:4,L:5,H:6,L:7,H:8,L:9,H:10,L:11,H:12
and ANDed signal it will fail 2015 the Unique Previous condition.

5.b.: Get the next signal 2025 (i.e., Signal 1 or AS) Since signal 1 has a LOW value at 3 invert it and AND with incoming signal, Signal O. The result will be: L:3,H:4,L:5,H:6,L:7,H:8,L:12

The above ANDed signal has an edge at time unit 3 and no edge prior to that edge so it passes Unique Previous condition.

5. . . : None of the other signals in the Available List ANDed with the incoming signal satisfy the Unique Previous condition.

5.h.: The options list 2020 looks like the following:

| (0,)/1 | L:3,H:4,L:5,H:6,L:7,H:8, L:12 |
|---|---|

5.i.: Call Find Best 2035. The Available List now appears in Table II below with clock (signal 0) and AS (signal 1) tagged.

TABLE II

| INDEX | EQUATION BUFFER | TAG | VECTOR |
|---|---|---|---|
| 0 | | X | CLOCK(0)L:1,H:2,L:3,H:4, L:5,H:6,L:7,H:8,L:9, H:10,L:11,H:12 |
| 1 | | X | AS(I) H:3,L:8,H:12 |
| 2 | | | A16(I) H:2,L:9,H:12 |
| 3 | | | A15(I) L:2,H:12 |
| 4 | | | RW(I) H:2,L:9,H:12 |
| 5 | | | OE(0) L:6,H:8,L:12 LOW-TRUE |
| 6 | | | RAS(0) L:4,H:8,L:12 LOW-TRUE |
| 7 | | | CAS(0) L:5,H:9,L:12 LOW-TRUE |
| 8 | | | ENABLE(0) L:6,H:8,L:12 |

Level 6 - Find Best (FIG. 12)

Get the first (and only) signal in the option list (i.e., /1 from step 5h, above). Call Check Unique 1250 with 1st signal in option list.

Level 7 - Check Unique (FIG. 14)

7.a.: Signal passes Unique Previous condition
7.b.: Signal passes Unique End condition (it has an end at 4)
7.c.: Signal does not pass Unique After condition (it has a HIGH value at 7), therefore call Find Unique After 1445.

Level 8 - Find Unique After (FIG. 28)

The option list still has the /1 signal ANDed with signal O as set forth below.

| (0,)/1 | L:3,H:4,L:5,H:6,L:7,H:8, |
|---|---|

-continued

| | |
|---|---|
| | L:12 |

8. . . : AND 2820 the incoming signal (i.e., 0*/1 above) with first untagged signal from Available List and obtain all those that results in a Unique After condition. These are then ANDed with the incoming signal

| | |
|---|---|
| (0,/1,)/5 | L:3,H:4,L:5,H:6,L:12 |
| (0,/1,)/6 | L:3,H:4,L:12 |
| (0,/1,)/7 | L:3,H:4,L:12 |

8.n. Call Find Best 2875

Level 9 - Find Best (FIG. 12)

All of the signals in the options list, above, will pass Check Unique 1215 and they all end at time unit 4 (i.e., having the same overlap 1245) so the first one in the list is picked.

Return to Level 8 - Find Unique After (FIG. 28)

8.f.: Best signal is found 2890 to satisfy the Unique After condition. Its equation 2895 is added to the equation buffer of the incoming signal and its vector replaces the incoming signal's vector. The options list now reads:

| | |
|---|---|
| (0,)/1,/5 | L:3,H:4,L:5,H:6,L:12 |

Return to Level 7 - Check Unique (FIG. 14)

7.d.: The resulting signal set forth in the above options list is again checked against conditions 1400, 1405, and 1410

7.e.: All the above conditions are passed 1420.

Return to Level 6 - Find-best (FIG. 12)

6.b.: Since there is only one item in options list and it passes Check Unique, it is selected as best signal at 1260 to 1275.

Return to Level 5 - Find Unique Previous (FIG. 20)

The options list now comprises the ANDed */1*/5 signal as set forth below:

| | |
|---|---|
| (0,)/1,5 | L:3,H:4,L:5,H:6,L:12 |
| 5.j. | Best signal is found to satisfy 2040 the Unique Previous condition its equation buffer is added 2050 to the equation buffer of the incoming signal and its vector replaces the incoming signal's vector. |
| The options list now contains the signal O information in the equation buffer: | |
| 0,/1,/5 | L:3,H:4,L:5,H:6,L:12 |

Return to Level 4 - Check Unique (FIG. 14)

4.b.: The above signal passes Unique End condition 1400

4.c.: The above signal passes Unique After condition 1405

4.d.: Since it initially did not pass 4.a. it is checked against the conditions 4.a., 4.b. and 4.c. again.

4.e.: All the above conditions are passed 1415

Return to Level 3 - Find Best (FIG. 12)

3.b. clear all the corresponding tags and call Check Unique 1225 with the second item in the list The options list still contains as the first signal:

| | |
|---|---|
| 0,/1,/5 | L:3,H:4,L:5,H:6,L:12 |

The Available List has all tags removed as shown in Table III:

TABLE III

| INDEX | EQUATION BUFFER | TAG | VECTOR |
|---|---|---|---|
| 0 | | | CLOCK(0) L:1,H:2,L:3,H:4, L:5,H:6,L:7,H:8,L:9, H:10,L:11,H:12 |
| 1 | | | AS(I) H:3,L:8,H:12 |
| 2 | | | A16(I) H:2,L:9,H:12 |
| 3 | | | A15(I) L:2,H:12 |
| 4 | | | RW(I) H:2,L:9,H:12 |
| 5 | | | OE(0) L:6,H:8,L:12 LOW-TRUE |
| 6 | | | RAS(0) L:4,H:8,L:12 LOW-TRUE |
| 7 | | | CAS(0) L:5,H:9,L:12 LOW-TRUE |
| 8 | | | ENABLE(0) L:6,H:8,L:12 |

Level 10 - Check Unique (FIG. 14)

The incoming signal (i.e., second signal) is:

| | |
|---|---|
| /1 | L:3,H:8,L:12 |

10.a.: The above signal passes Unique Previous condition 1400

10.b.: The above signal does not pass Unique End condition 1405, so call Find Unique End 1435

Level 11 - Find Unique End (FIG. 26)

The incoming of failed signal is:

| | |
|---|---|
| /1 | L:3,H:8,L:12 |

11. . . : AND 2620 the incoming signal with first available signal, and so on until all of the combined signals have been tested for a Unique End condition. The options list contains the following three signals ANDed with /1:

| | |
|---|---|
| (/1,)0 | L:3,H:4,L:5,H:6,L:7,H:8, L:12 |
| (/1,)/8 | L:3,H:6,L:12 |
| (/1,)/5 | L:3,H:6,L:12 |

11.h.: Call Find Best 2665

11.i.: Best signal is found 2670 to satisfy the Unique End condition. Its equation buffer is added to the equation buffer of the incoming signal and its vector replaces the incoming signal's vector. The Best signal is the following ANDed with /1:

TABLE IV

| INDEX | EQUATION BUFFER | TAG | VECTOR |
|---|---|---|---|
| 0 | | | CLOCK(0) L:1,H:2,L:3,H:4, |

TABLE IV-continued

| INDEX | EQUATION BUFFER | TAG | VECTOR |
|---|---|---|---|
|   |   |   | L:5,H:6,L:7,H:8,L:9, H:10,L:11,H:12 |
| 1 |   | X | AS(I) H:3,L:8,H:12 |
| 2 |   |   | A16(I) H:2,L:9,H:12 |
| 3 |   |   | A15(I) L:2,H:12 |
| 4 |   |   | RW(I) H:2,L:9,H:12 |
| 5 |   |   | OE(0) L:6,H:8,L:12 LOW-TRUE |
| 6 |   |   | RAS(0) L:4,H:8,L:12 LOW-TRUE |
| 7 |   |   | CAS(0) L:5,H:9,L:12 LOW-TRUE |
| 8 |   | X | ENABLE(0) L:6,H:8,L:12 |

The Available List is tagged as shown in Table IV below:

| (/1,)/8 | L:3,H:6,L:12 |
|---|---|

Return to Level 10 - Check Unique (FIG. 14)

10.c.: The above /1*/8 Best signal passes Unique After 1440 condition 10.d.: Since it initially did not pass 10.a. it is checked against the conditions 10.a., 10.b. and 10.c. again 1415.

10.e.: All the above conditions are passed 1420 (no error condition)

Return to Level 3 - Find Best (FIG. 12)

3.c.: Pick the signal that covers 1245 the most of the selected output, the two signals are:

| first item |   |
|---|---|
| 0,/1,/5 | L:3,H:4,L:5,H:6,L:12 |
| second item |   |
| /1,/8 | L:3,H:6,L:12 |

3.d.: Obviously the choice is the second item. clear all the corresponding tags so that the Available List appears as it did in Table I.

Return to Level 2 - Find Previous Edge (FIG. 9)

2.b.: The second item, /1,/8, in the list is the best choice 970 and its equation buffer contents are written into the equation buffer of the available list 980:

| EQUATION BUFFER | VECTORS |
|---|---|
| 0,/1,/5 | L:3,H:4,L:5,H:6,L:12 |
| /1,/8 | L:3,H:6,L:12 |

1.e. The equation is written out 650:/AS*/ENABLE
1.f. End of the resulting signal is time unit 6 and it is less than End 660 so Current-Ptr = 6
1.g. Call Find Previous Signal 680

The above example illustrates the recursive nature of the waveform analysis of the present invention through stage 660 of the Extract routine of FIG. 6 and for the selected RAS output signal of FIG. 40.

Figure 41:
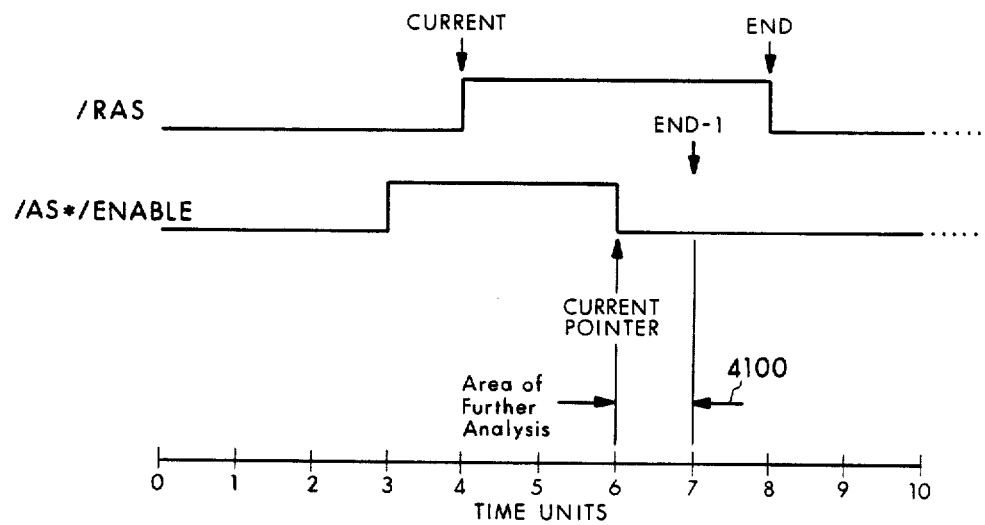
FIG. 41 shows the construction of RAS with design information of the constructed waveform for the region of the selected output.

FIG. 41 shows the construction of RAS with the design information of the constructed waveform "/AS*/ENABLE" for the region of the selected output from "Current" to "Current Pointer." The Previous Signal routine of FIG. 36 is entered and "Current" is set to "Current Pointer" and the above process is repeated in order to fill in the remaining portion 4100. These new region expressions are ORed together to form the final Boolean expression which is /AS*/ENABLE+/ENABLE*/CLK for RAS.

While preferred embodiments of the present invention have been shown, it is to be expressly understood that modifications and changes may be made thereto and that the present invention is set forth in the following claims. For example, the preferred embodiments has assigned synchronous digital circuits; however, it is to be expressly understood that the teachings of the present invention can be applied to asynchronous circuits. It is to be expressly understood that each of the waveform routines set forth in the figures could be executed individually or in an order different from that discussed above. For example, the Check Unique routine could be used alone to determine the Uniqueness of waveforms.

We claim:

1. An automated waveform analysis method for designing, on a computer, a logic implementation of an interface circuit connected between at least one first digital device and at least one second digital device from inputted data to said computer, said inputted data being an input and output waveforms from said first and second digital devices to said interface circuit so that said interface device permits logic and timing compatibility between said first and second devices, said computer having an input, a memory, and an output, said method comprising the steps of:
   (a) inputting into said input of said computer the following waveform information: (1) identity of each of said input and output waveforms, (2) whether each said waveform is an input or an output, (3) a time for each asserted and non-asserted pulse in each of said waveforms,
   (b) storing in said memory of said computer said waveform information;
   (c) selecting, via said computer from said memory an output waveform;
   (d) identifying, via said computer, in said memory those waveforms or their compliments which alone or logically combined with other waveforms stored in said memory constructs a waveform corresponding to said selected output waveform so that said constructed waveform permits said logical and timing capability,
   (e) storing in said memory of said computer design information necessary for said construction of said selected output, said design information including: (1) identity of each of said waveforms necessary to construct said selected output for said compatibility, (2) a logical operation required such as compliment, AND, or OR for each aforesaid identified waveform, and (3) a time for each asserted and non-asserted pulse in said constructed waveform,
   (f) repeating steps (c) through (e) for each remaining output waveform in said memory, and
   (g) delivering to said output of said computer said design information signals when all output waveforms have been selected.

2. The method of claim 1 wherein the step of inputting further comprises the step of entering said waveform information into a symbol table in said memory in the form of:

$$XX\ 0/1\ V_1{:}t_1\ V_2{:}t_2\ V_1{:}t_3\ V_2{:}t_4$$

where

XX=identity of said waveform;
O/I=whether the waveform is an output or an input;
V1=non-asserted state of the waveform;
V2=asserted state of the waveform; and
t=time unit of assertion or non-assertion.

3. The method of claim 1 in which the step of identifying further comprises the step of determining, via said computer, all waveforms in said memory which are periodic with the asserted pulses of said selected output, periodic waveforms being those waveforms that have the same pattern each time said selected output is asserted.

4. The method of claim 1 in which the step of identifying further comprises the step of finding, via said computer, all waveforms in said memory that have a previous edge one time unit prior to a first edge of said selected output.

5. The method of claim 1 in which the step of identifying further comprises the step of fining, via said computer, a best waveform of all waveforms wherein said best waveform is the waveform having an asserted pulse with the most overlap with the asserted pulse of said selected output.

6. The method of claim 1 in which the step of identifying further comprises the step of checking the uniqueness of each waveform, said step of checking uniqueness comprising each of the following steps:
   (a) passing a condition of Unique Previous wherein the waveform has a unique edge one time unit previous to a first edge of said selected signal without a transition prior to said unique edge while said selected output is in the non-asserted state,
   (b) passing a condition of Unique End wherein the waveform must end before said selected output ends, and
   (c) passing a condition of Unique After wherein the waveform must remain in an unasserted state up to one time unit before said selected output again becomes asserted.

7. An automated waveform analysis method for designing, on a computer, a logic implementation of an interface circuit connected between at least one first digital device and at least one second digital device from inputted data to said computer, said inputted data being an input and output waveforms from said first and second digital devices to said interface circuit so that said interface device permits logic and timing compatibility between said first and second devices, said computer having an input, a memory, and an output, said method comprising the steps of:
   (a) inputting into said input of said computer the following waveform information: (1) identity of each of said input and output waveforms, (2) whether each said waveform is an input or an output, (3) a time for each asserted and non-asserted pulse in each of said waveforms,
   (b) storing in said memory of said computer said waveform information,
   (c) selecting, via said computer, from said memory an output waveform,
   (d) identifying, via said computer, in said memory those waveforms or their compliments which alone or either ANDed or ORed with other waveforms stored in said memory constructs a waveform corresponding to said selected output waveform so that said constructed waveform permits said logical and timing compatibility,
   (e) storing in said memory of said computer design information necessary for said construction of said selected output, said design information including: (1) identity of each of said waveforms necessary to construct said selected output for said compatibility, (2) a logical operation required such as compliment, AND, or OR for each aforesaid identified waveform, and (3) a time for each asserted and non-asserted pulse in said constructed waveform,
   (f) storing in said memory of said computer an error signal in the event said step of identifying is unable to construct a waveform corresponding to said selected output.
   (g) repeating steps (c) through (f) for each remaining output waveform in said memory, and
   (h) delivering to said output of said computer said design information and error signals when all output waveforms have been selected.

8. The method of claim 7 wherein the step of inputting further comprises the step of entering said waveform information into an Available List in a symbol table in said memory in the form of:

$$XX\ O/I\ V_1:t_1\ V_2:t_2\ V_1:t_3\ V_2:t_4$$

where
XX=identity of said waveform;
O/I=whether the waveform is an output or an input;
V1=non-asserted state of the waveform;
V2=asserted state of the waveform; and
t=time unit of assertion or non-assertion.

9. The method of claim 7 in which the step of identifying further comprises the step of determining, via said computer, all waveforms in said memory which are periodic with the asserted pulses of said selected output, periodic waveforms being those waveforms that have the same pattern each time said selected output is asserted.

10. The method of claim 7 in which the step of identifying further comprises the step of finding, via said computer, all waveforms in said memory that have a previous edge as time unit prior to a first edge of said selected output.

11. The method of claim 7 in which the step of identifying further comprises the step of finding, via said computer, a best waveform of all waveforms wherein said best waveform is the waveform having an asserted pulse with the most overlap with the asserted pulse of the selected output.

12. The method of claim 7 in which the step of identifying further comprises the step of checking the uniqueness of each waveform, said step of checking uniqueness comprising each of the following steps:
   (a) passing a condition of Unique Previous wherein said waveform has a unique edge one time unit previous to a first edge of said selected signal without a transition prior to said unique edge while said selected output is in the non-asserted state,
   (b) passing a condition of Unique End wherein said waveform must end before said selected output ends, and
   (c) passing a condition of Unique After wherein said waveform must remain in an unasserted state up to one time unit before said selected output becomes asserted.

13. An automated waveform analysis method for designing, on a computer, a logic implementation of an interface circuit connected between at least one first digital device and at least one second digital device from inputted data to said computer, said inputted data being an input and output waveforms from said first and second digital devices to said interface circuit so that said interface device permits logic and timing compatibility between said first and second devices, said computer having an input, a memory, and an output, said method comprising the steps of:

(a) inputting into said input of said computer the following waveform information: (1) identity of each of said input and output waveforms, (2) whether each said waveform is an input or an output, (3) a time for each asserted and non-asserted pulse in each of said waveforms, (b) storing in said memory of said computer said waveform information, (c) selecting, via said computer, from said memory an output waveform, (d) determining, via said computer, all waveforms in said memory which are periodic with the asserted pulses of said selected output, periodic waveforms being those waveforms that have the same pattern each time said selected output is asserted, (e) finding, via said computer, all determined periodic waveforms in said memory that have a previous edge one time unit prior to a first edge of said selected output, (f) finding, via said computer, a best waveform of all found previous edge waveforms wherein said best waveform is the waveform having an asserted pulse with the most overlap with the asserted pulse of said selected output, (g) checking the uniqueness of each of said determined periodic waveform, said step of checking uniqueness comprising each of the following sub-steps:

(1) passing a condition of Unique Previous wherein said determined periodic waveform has a unique edge one time unit previous to the first edge of said selected signal without a transition prior to said unique edge while said selected output is in the non-asserted state, (2) passing a condition of Unique End wherein said determined periodic waveform must end before said selected output ends, (3) passing a condition of Unique After wherein said determined periodic waveform must remain in an unasserted state up to one time unit before said selected output again becomes asserted, (h) identifying, via said computer, in said memory those waveforms or their compliments which alone or logically combined with other waveforms stored in said memory constructs a waveform passing steps (d) through (g) above corresponding to said selected output waveform so that said constructed waveform permits said logical and timing compatibility, (i) storing in said memory of said computer design information necessary for said construction of said selected output, said design information including: (1) identity of each of said waveforms necessary to construct said selected output for said compatibility, (2) a logical operation required such as compliment, AND, or OR for each aforesaid identified waveform, and (3) a time for each asserted and non-asserted pulse in said constructed waveform, (j) repeating steps through (c) through (i) for each remaining output waveform in said memory, and (k) delivering to said output of said computer said design information signals when all output waveforms have been selected.

14. The method of claim 13 wherein the step of inputting further comprises the step of entering said waveform information into a symbol table in said memory in the form of:

$$XX\ O/I\ V_1{:}t_1\ V_2{:}t_2\ V_1{:}t_3\ V_2{:}t_4$$

where $XX$ = identity of said waveform;
$0/I$ = whether the waveform is an output or an input;
$V_1$ = non-asserted state of the waveform;
$V_2$ = asserted state of the waveform; and
$t$ = time unit of assertion or non-assertion.

15. An automated waveform analysis system for designing a logic implementation of an interface circuit connected between at least one first digital device and at least one second digital device so that said interface device permits logic and timing compatibility between said first and second devices, said system comprising:

a computer, means for inputting into said computer the following waveform information: (1) identity of each of said input and output waveforms, (2) whether each said waveform is an input or an output, and (3) a time for each asserted and non-asserted pulse in each of said waveforms for each input and output waveform from said first and second digital devices to said interface circuit, means operative with said inputting means for storing in said computer said waveform information, means operative with said storing means for selecting each output waveform, means in said computer for identifying those waveforms or their compliments which alone or logically combined with other waveforms in said storing means constructs a waveform corresponding to each said selected output waveform so that said constructed waveform permits said logical and timing compatibility, means operative with said identifying means for storing the design information necessary for said construction of each said selected output, said design information including: (1) identity of each of said waveforms necessary to construct said selected output for said compatibility, (2) a logical operation required such as compliment, AND, or OR for each aforesaid identified waveform, and (3) a time for each asserted and non-asserted pulse in said constructed waveform, and means operative with said design information storing means for delivering said design information signals from said computer when all output waveforms have been selected.

* * * * *